(12) United States Patent  
Kim et al.

(10) Patent No.: US 9,391,240 B2  
(45) Date of Patent: Jul. 12, 2016

(54) METHOD FOR FORMING TRANSPARENT ELECTRODE AND SEMICONDUCTOR DEVICE MANUFACTURED USING SAME

(75) Inventors: Tae Geun Kim, Seongnam (KR); Hee-Dong Kim, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 14/398,783

(22) PCT Filed: Sep. 10, 2012

(86) PCT No.: PCT/KR2012/007254  
§ 371 (c)(1),  
(2), (4) Date: Nov. 4, 2014

(87) PCT Pub. No.: WO2013/172511  
PCT Pub. Date: Nov. 21, 2013

(65) Prior Publication Data  
US 2015/0137367 A1    May 21, 2015

(30) Foreign Application Priority Data  
May 14, 2012  (KR) ........................ 10-2012-0050932

(51) Int. Cl.  
*H01L 23/48*      (2006.01)  
*H01L 23/52*      (2006.01)  
(Continued)

(52) U.S. Cl.  
CPC ................ *H01L 33/42* (2013.01); *H01L 29/45* (2013.01); *H01L 33/005* (2013.01); *H01L 51/442* (2013.01); *H01L 51/444* (2013.01); *H01L 2933/0016* (2013.01)

(58) Field of Classification Search  
CPC .................. H01L 33/42; H01L 33/005; H01L 2933/0016  
USPC ............................................. 257/741; 438/46  
See application file for complete search history.

(56) References Cited

U.S. PATENT DOCUMENTS

| | | | |
|---|---|---|---|
| 3,988,720 A | 10/1976 | Ovshinsky | |
| 2001/0019244 A1* | 9/2001 | Yamazaki | H05B 33/28 313/506 |

(Continued)

FOREIGN PATENT DOCUMENTS

| | | |
|---|---|---|
| JP | 2011-258631 | 12/2011 |
| KR | 10-2009-0032366 | 4/2009 |

(Continued)

OTHER PUBLICATIONS

International Search Report for International Application No. PCT/KR2012/007254, dated Feb. 14, 2013.

(Continued)

*Primary Examiner* — David S Blum  
(74) *Attorney, Agent, or Firm* — Kile Park Reed & Houtteman PLLC

(57) ABSTRACT

Provided are a method for forming a transparent electrode and a semiconductor device where the transparent electrode is formed by using the method. The method for forming a transparent electrode includes: forming a transparent electrode by using a transparent material of which resistance state is to be changed from a high resistance state into a low resistance state according to an applied electric field; and performing a forming process of changing the resistance state of the transparent electrode into the low resistance state by applying a voltage to the transparent electrode, so that the transparent electrode has conductivity. Accordingly, it is possible to form the transparent electrode having good ohmic characteristic with respect to the semiconductor layer formed above or below the transparent electrode and high transmittance with respect to the light having a short wavelength in a UV wavelength range as well as the light in visible wavelength range.

22 Claims, 20 Drawing Sheets

(51) Int. Cl.
*H01L 29/40* (2006.01)
*H01L 21/00* (2006.01)
*H01L 33/42* (2010.01)
*H01L 29/45* (2006.01)
*H01L 33/00* (2010.01)
*H01L 51/44* (2006.01)

(56) References Cited

U.S. PATENT DOCUMENTS

2003/0059972 A1  3/2003  Ikeda et al.
2012/0132882 A1* 5/2012  Seo .................. H01L 21/84
                                          257/4
2012/0292634 A1* 11/2012 Bae .................. H01L 33/42
                                          257/76

FOREIGN PATENT DOCUMENTS

| KR | 10-2010-0054074 | 5/2010 |
| KR | 10-2010-0056114 | 5/2010 |
| KR | 10-2011-0121338 | 11/2011 |
| KR | 10-2012-0003775 | 1/2012 |
| KR | 10-2012-0044545 | 5/2012 |
| TW | 201200467 | 1/2012 |

OTHER PUBLICATIONS

Extended European Search Report for European Application No. 12876740, dated Nov. 13, 2015.

* cited by examiner

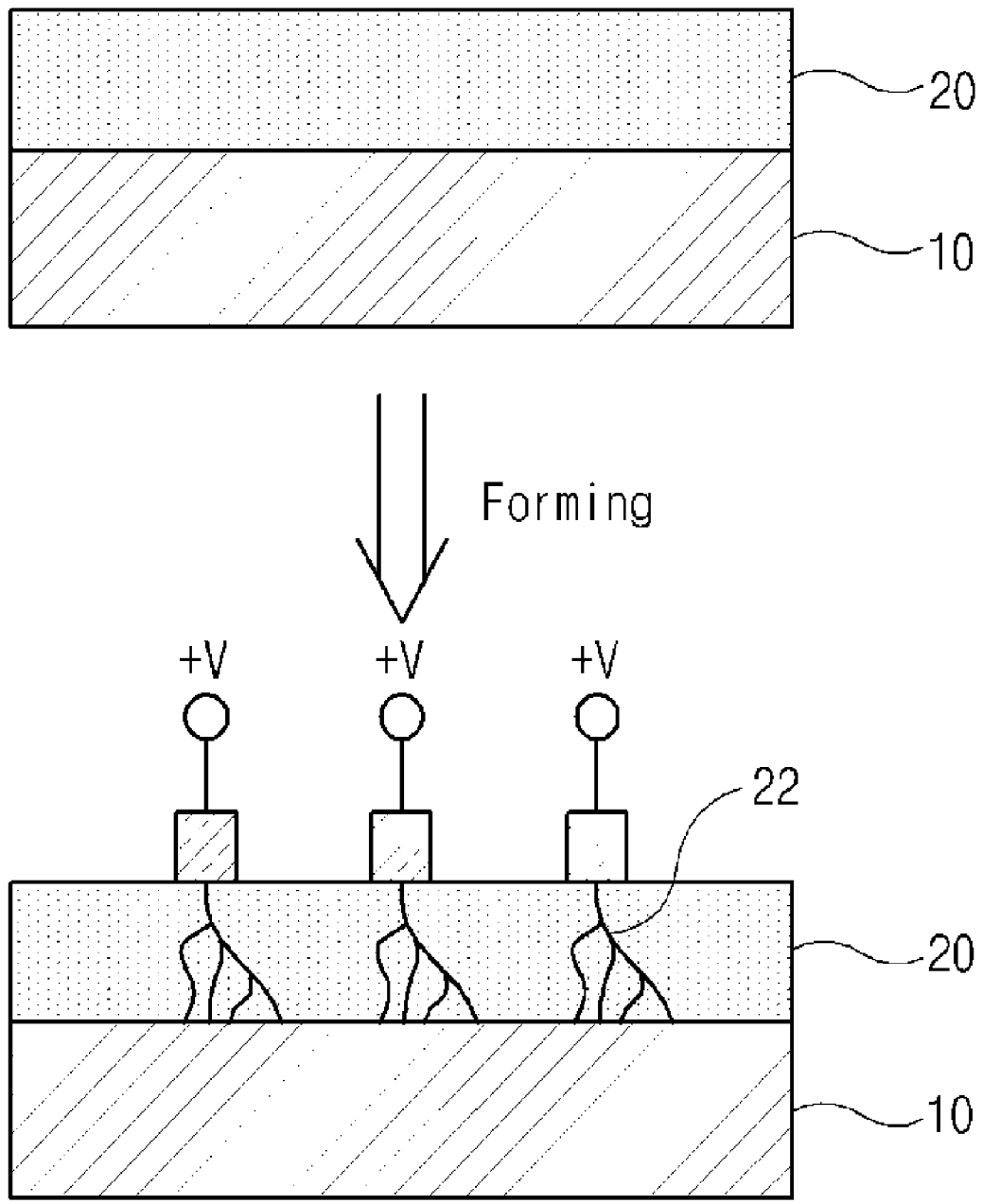

METHOD FOR FORMING TRANSPARENT ELECTRODE AND SEMICONDUCTOR DEVICE MANUFACTURED USING SAME

BACKGROUND OF THE INVENTION

1. Field of the Invention

The present invention relates to a semiconductor device, and more particularly, to a method for forming a transparent electrode and a semiconductor device manufactured using the method.

2. Description of the Related Art

Transparent electrodes have been used in various application fields such as LEDs, solar cells, medical UV sterilizers, and fisheries, and the application fields and their demands have been gradually increased. Particularly, the transparent electrodes have been actively used in the LED field. The transparent electrode technique currently applied to the LEDs is mainly an ITO (Indium Tin Oxide) based technique which can be applied to a visible wavelength range of 400 nm to 800 nm and a UV wavelength range of 365 nm to 400 nm in the entire UV wavelength range of 10 nm to 400 nm.

Recently, demands for UV LEDs generating light in a UV wavelength range has been greatly increased. However, a transparent electrode having high conductivity and high transmittance in the UV wavelength range has not been developed, so that it is difficult to commercialize the UV LEDs.

For example, in the case of a UV LED where an ITO transparent electrode which is currently actively used is formed, most of light in a UV wavelength range of 10 nm to 320 nm generated in an activation layer is absorbed by an ITO layer, so that only about 1% of the light can be transmitted through the ITO layer to be extracted to an external portion.

FIG. 1 is a graph illustrating transmittance in the case where an ITO transparent electrode is formed on a p-GaN semiconductor layer in the related art. As illustrated in FIG. 1, although the transparent electrode has transmittance of 80% or more with respect to the light in a wavelength range of 350 nm or more, the transmittance is greatly decreased with respect to the light having a short wavelength in the UV wavelength range. Particularly, the transmittance is decreased to 20% or less with respect to the light having a short wavelength in the UV wavelength range of 280 nm or less.

In order to solve the above problem, in the related art, a metal electrode pad is directly formed on a semiconductor layer such as p-AlGaN instead of forming the transparent electrode on the semiconductor layer. However, the metal and the semiconductor layer are not in ohmic contact to each other because of a large difference in work function between the metal and the semiconductor layer, and current is concentrated on a metal electrode pad, but current is not supplied into the entire activation layer, so that an amount of the light generated by the activation layer is greatly decreased.

In order to solve the above problem, various researches have been made, but a transparent electrode having high conductivity and high transmittance in a UV wavelength range has not yet been developed. This is because conductivity and transmittance of a material is basically in trade-off relationship. Since a material having high transmittance in a UV wavelength range has a large band gap, the conductivity thereof is too low to be used as an electrode, and since the material is not in ohmic contact with a semiconductor material, it is impossible to use the above material as an electrode.

As an example of a technique for solving the above problem, a technique where a transparent electrode is constructed with a sliver (Ag) thin film is disclosed in Korean Patent Application No. 10-2007-0097545. However, in the related art, in the case where the transparent electrode is formed by using Ag, it is very difficult to deposit a thin silver layer on a semiconductor layer so that the thin sliver layer is in ohmic contact with the semiconductor layer. In addition, although a thin silver layer is deposited on the semiconductor layer, as illustrated in the graph of FIG. 4 of the above Patent Document, with respect to the light in a wavelength range 420 nm or less, the transmittance is greatly decreased to 80% or less; and with respect to the light in a wavelength range 380 nm or less, the transmittance is decreased to 50% or less. Therefore, the transmittance in the above-described technique has no difference from the transmittance of the ITO transparent electrode in the related art, and thus, it is difficult to improve the transmittance in a UV wavelength range up to a practical level.

SUMMARY OF THE INVENTION

The present invention is to provide a method for forming a transparent electrode having high transmittance and high conductivity with respect to light having a short wavelength in a UV wavelength range as well as in a visible wavelength range and good ohmic characteristic with respect to a semiconductor layer and a semiconductor device manufactured by using the method.

According to an aspect of the present invention, there is provided a semiconductor device including: a semiconductor layer; and a transparent electrode of which one surface is in contact with the semiconductor layer and of which resistance state is changed from a high resistance state into a low resistance state according to an applied electric field. Since the transparent electrode is constructed with a transparent material of which transmittance is high and of which resistance state is to be changed from a high resistance state into a low resistance state by applying an electric field, it is possible to obtain a semiconductor device where a transparent electrode having high transmittance characteristic with respect to light in a UV wavelength range and ohmic contact characteristic is formed.

In the above aspect, the semiconductor device may further include a metal electrode pad which is formed with a metal on a surface of the transparent electrode opposite to the one surface of the transparent electrode which is in contact with the semiconductor layer.

In addition, in the above aspect, conducting filaments may be formed in the transparent electrode by performing a forming process. When the conducting filaments are formed in the transparent electrode by performing the forming process, current can flow through the conducting filaments, the transparent electrode has low resistance and good ohmic characteristic.

In addition, in the above aspect, the transparent electrode may be formed by using a transparent insulating material having a large band gap, which is to be changed to have conductivity if a forming process is performed on the material by applying a threshold voltage or more inherent in the material. Before the forming process, since the band gap of the transparent electrode according to the present invention is large, the transparent electrode is an insulating material having high transmittance and high resistance. By performing the forming process, the resistance state of the transparent electrode can be changed so that the transparent electrode has conductivity while maintaining high transmittance.

In addition, in the above aspect, the transparent electrode may be in ohmic contact with the semiconductor layer. After the forming process, the transparent electrode according to the present invention is changed from a high resistance state into a low resistance state, so that the transparent electrode is in ohmic contact with the semiconductor layer.

In addition, in the above aspect, the semiconductor layer may be doped as an n type or a p type. When the semiconductor layer is doped in such a manner, the current can easily flow through the semiconductor layer, so that it is possible to obtain good ohmic characteristic with respect to the transparent electrode.

In addition, in the above aspect, the transparent electrode may be constructed with any one of a transparent oxide based material, a transparent nitride based material, a transparent polymer based material, and a transparent nano material.

In addition, in the above aspect, the semiconductor device may further include a CNT (Carbon nanotube) layer or a graphene layer which is formed on a surface of the transparent electrode opposite to the one surface of the transparent electrode which is in contact with the semiconductor layer, or the semiconductor device may further include a CNT layer or a graphene layer which is formed between the transparent electrode and the semiconductor layer. Since the conducting filaments in the transparent electrode are connected to each other by forming the CNT layer or the graphene layer on the one surface of the transparent electrode where the conducting filaments are formed, it is possible to solve the problem of current concentration caused by disconnection of some conducting filaments.

According to another aspect of the present invention, there is provided a method for forming a transparent electrode, including: (a) forming a transparent electrode by using a transparent material of which resistance state is to be changed from a high resistance state into a low resistance state according to an applied electric field; and (b) performing a forming process of changing the resistance state of the transparent electrode to the low resistance state by applying a voltage to the transparent electrode.

Since the transparent electrode is constructed with a transparent material of which transmittance is high and of which resistance state is to be changed from a high resistance state into a low resistance state by applying an electric field, it is possible to obtain a semiconductor device where a transparent electrode having high transmittance characteristic with respect to light in a UV wavelength range and ohmic contact characteristic is formed.

In addition, in the above aspect, the transparent electrode may be formed on a semiconductor layer, or the method may further include forming the semiconductor layer on the transparent electrode which the forming process is performed on. Accordingly, the present invention can be adapted to a semiconductor device such as an OLED or a solar cell where a semiconductor layer is formed on a transparent electrode as well as a semiconductor device such as a typical LED where a transparent electrode is formed on a semiconductor layer.

In addition, in the above aspect, the transparent electrode may be formed on a CNT layer or a graphene layer formed on a semiconductor layer, or the method may further include forming a CNT layer or a graphene layer on the transparent electrode which the forming process is performed on In addition, in the above aspect, the transparent electrode may be formed on a CNT layer or a graphene layer, or the method may further include forming a CNT layer or a graphene layer on the transparent electrode on which the forming process is performed and forming a semiconductor layer on the CNT layer or the graphene layer.

Since the conducting filaments in the transparent electrode are connected to each other by forming the CNT layer or the graphene layer on the one surface of the transparent electrode where the conducting filaments are formed, it is possible to solve the problem of current concentration caused by disconnection of some conducting filaments.

In addition, in the above aspect, the method may further include (c) forming a metal electrode pad on the transparent electrode.

In addition, in the above aspect, in the (b) performing of the forming process, conducting filaments may be formed in an insulating material of the transparent electrode which the forming process is performed on. When the conducting filaments are formed in the transparent electrode by performing the forming process, current can flow through the conducting filaments, the transparent electrode has low resistance and good ohmic characteristic In addition, in the above aspect, the transparent electrode may be formed by using a transparent insulating material having a large band gap, which is to be changed to have conductivity if a forming process is performed on the material by applying a threshold voltage or more inherent in the material. Before the forming process, since the band gap of the transparent electrode according to the present invention is large, the transparent electrode is an insulating material having high transmittance and high resistance. By performing the forming process, the resistance state of the transparent electrode can be changed so that the transparent electrode has conductivity while maintaining high transmittance.

In addition, in the above aspect, the transparent electrode may be formed so as to be in ohmic contact with a semiconductor layer. After the forming process, the transparent electrode according to the present invention is changed from a high resistance state into a low resistance state, so that the transparent electrode is in ohmic contact with the semiconductor layer.

In addition, in the above aspect, the semiconductor layer may be doped as an n type or a p type. When the semiconductor layer is doped in such a manner, the current can easily flow through the semiconductor layer, so that it is possible to obtain good ohmic characteristic with respect to the transparent electrode.

In addition, in the above aspect, in the (b) performing of the forming process, a metal electrode may be formed on the transparent electrode, and the forming process may be performed by applying a threshold voltage or more inherent in a material of the transparent electrode to the metal electrode.

In addition, in the above aspect, the (b) performing of the forming process may include: (b1) forming photoresist on the transparent electrode; (b2) forming a pattern corresponding to a pair of electrodes on the photoresist; (b3) forming a pair of the electrodes by using the photoresist pattern; and (b4) removing the photoresist pattern and performing the forming process by applying a threshold voltage or more inherent in a material of the transparent electrode to a pair of the electrodes.

In addition, in the above aspect, the transparent electrode may be constructed with any one of a transparent oxide based material, a transparent nitride based material, a transparent polymer based material, and a transparent nano material.

According to the present invention, a transparent electrode is formed by using a transparent material of which resistance state is to be changed from a high resistance state into a low resistance state according to an applied electric field, and a forming process of changing the resistance state of the transparent electrode to the low resistance state is performed by applying a voltage to the transparent electrode, so that the transparent electrode has conductivity. Accordingly, it is possible to form the transparent electrode having good ohmic characteristic with respect to the semiconductor layer formed above or below the transparent electrode and high transmittance with respect to the light having a short wavelength in a UV wavelength range as well as the light in a visible wavelength range.

BRIEF DESCRIPTION OF THE DRAWINGS

The above and other features and advantages of the present invention will become more apparent by describing in detail exemplary embodiments thereof with reference to the attached drawings in which:

FIGS. 3a to 3c are diagrams illustrating characteristics of a resistance change material;

DETAILED DESCRIPTION OF THE INVENTION

Hereinafter, exemplary embodiments of the present invention will be described with reference to the attached drawings.

It should be noted that the present invention is applied to all the transparent electrodes (including transparent electrodes for OLEDs, transparent electrodes for solar cells, transparent electrodes for LEDs, and the like) which are in contact with a semiconductor layer, and the below-described embodiments are provided to explain the present invention.

Figure 2:
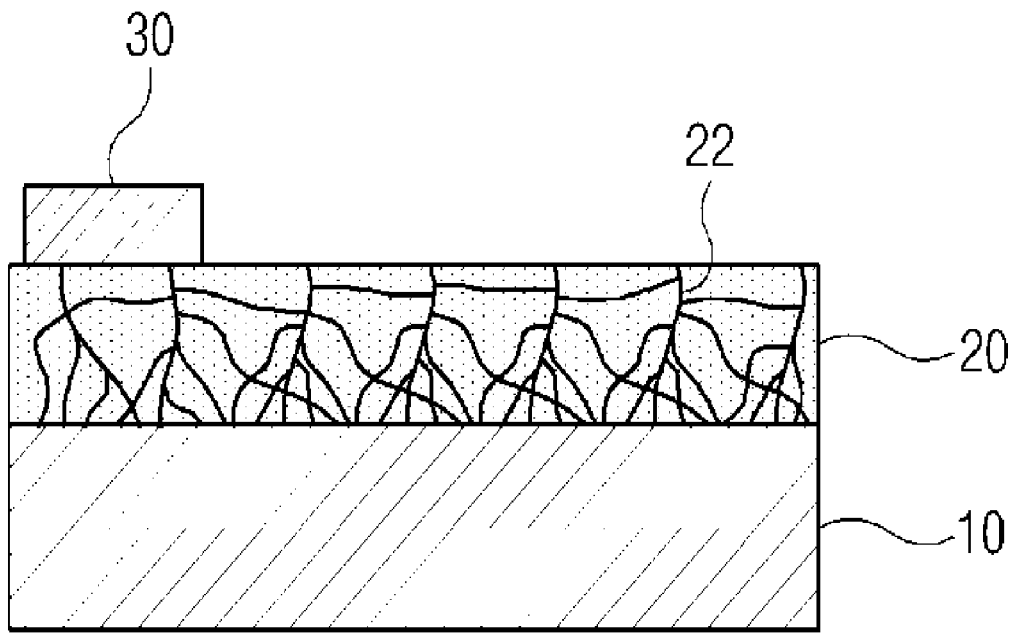
FIG. 2 is a diagram illustrating a structure of a semiconductor device including transparent electrodes according to an embodiment of the present invention.

FIG. 2 is a diagram illustrating a structure of a semiconductor device including transparent electrodes according to an embodiment of the present invention. Referring to FIG. 2, in a semiconductor device including transparent electrodes according to the embodiment of the present invention, a transparent electrode 20 is formed on a semiconductor layer 10 so that the semiconductor layer 10 and the transparent electrode 20 are in contact with each other, and a metal electrode pad 30 is formed on the transparent electrode 20.

It should be noted that the semiconductor layer 10 includes an inorganic semiconductor layer, an organic semiconductor layer, and any other materials where electric charges can move. The inorganic semiconductor layer includes a single-element semiconductor constructed with single elements such as Si or Ge. In addition, the inorganic semiconductor layer includes a compound semiconductor layer such as a nitride based compound semiconductor layer (GaN, AlGaN, InN, InGaN, AlN, or the like) and an oxide based compound semiconductor layer (GaO, ZnO, CoO, $IrO_2$, $Rh_2O_3$, $Al_2O_3$, SnO, or the like).

The inorganic semiconductor layer includes a semiconductor layer including materials constituting electron (hole) injection layers and electron (hole) transport layers of an OLED (Organic light Emitting Diode).

In order to improve a conductivity of the semiconductor layer 10, it is preferable that the surface of the semiconductor layer 10 which is in contact with the transparent electrode 20 is doped with p-type or n-type materials.

The transparent electrode according to the present invention is constructed with a transparent material (resistance change material) of which resistance state is to be changed according to an applied electric field. The resistance change material is mainly used in the field of ReRAM (resistive RAM). If a threshold voltage or more inherent in the material is applied to the material, electro-forming is performed, the resistance state of the resistance change material which is originally an insulating material is changed from a high resistance state into a low resistance state, so that the material has a conductivity.

Figure 3B:
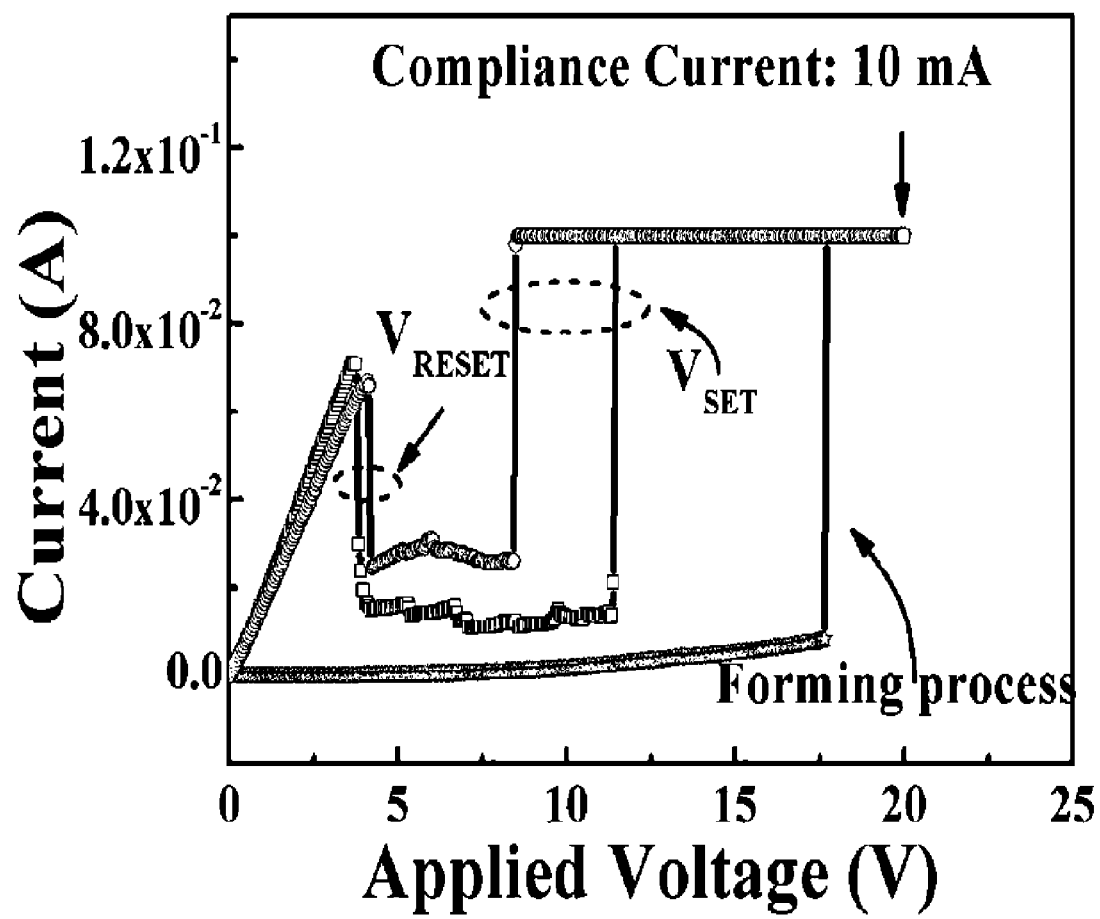
Figure 3C:
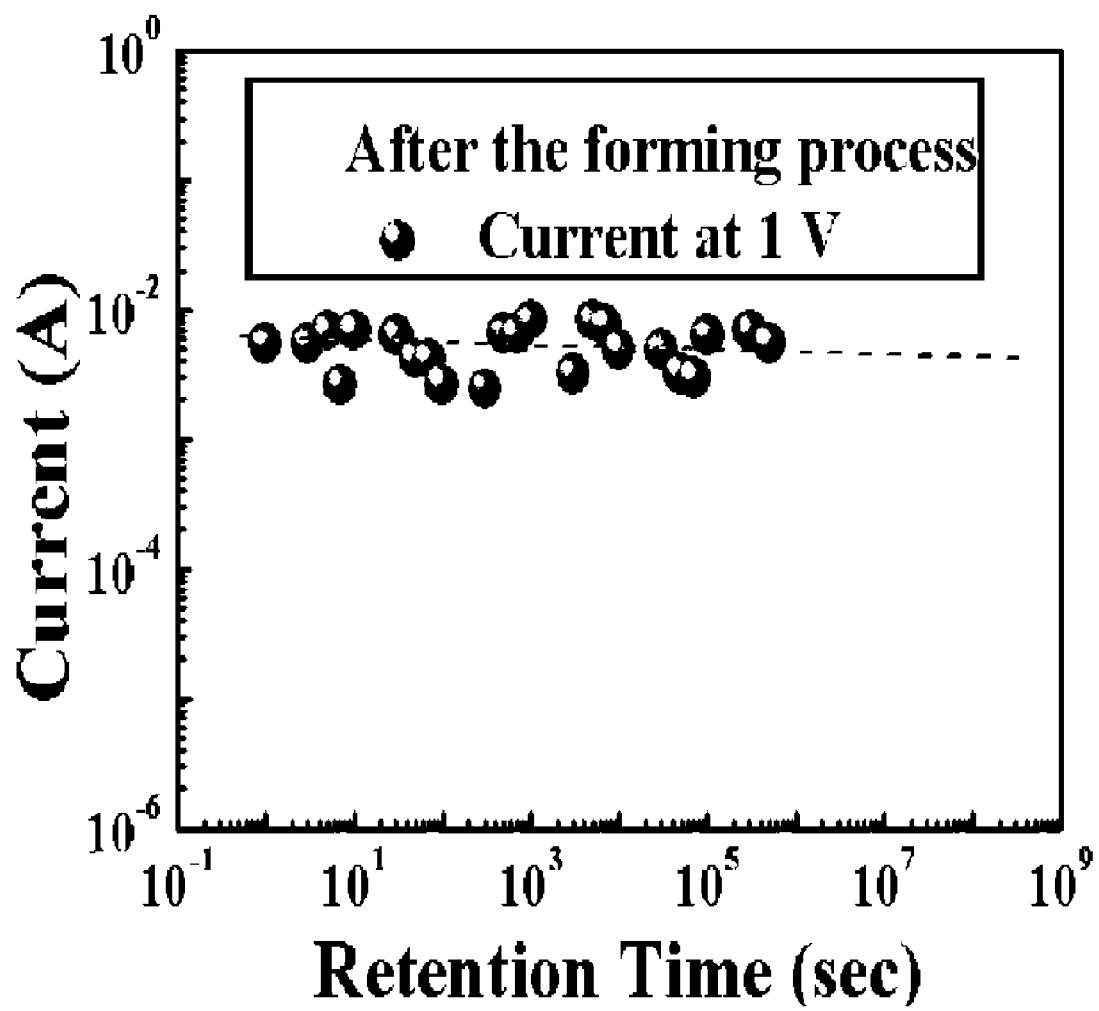

FIGS. 3a to 3c are diagrams illustrating characteristics of the resistance change material. Referring to FIG. 3a, if a threshold voltage or more is applied to the resistance change material which is an insulating material, electrode metal materials are inserted into a thin film due to electric stress (forming process), or conducting filaments 22 (or, metallic filaments) are formed in the resistance change material due to a defective structure in a thin film as illustrated in FIG. 3a. After that, although the voltage applied to the material is removed, the conducting filaments 22 remain, and current can flow through the conducting filaments 22, so that the low resistance state of the material is maintained.

Referring to FIG. 3b, it can be seen that the resistance change material (AlN) has an insulating characteristic before the forming process and has an I-V characteristic of a metal after the forming process. In addition, the conducting filaments formed in the transparent electrode can be formed (SET) or removed (RESET) by using the Joule heating effect as illustrated in FIG. 3b.

FIG. 3c is a graph illustrating how long the resistance state can be stably maintained after the conducting filaments are formed. It can be seen from a dotted line in the graph that the low resistance state can be stably maintained for ten years after the conducting filaments are formed.

In the embodiment of the present invention, a transparent conductive oxide based material ($SiO_2$, $Ga_2O_3$, $Al_2O_3$, ZnO, ITO, or the like), a transparent conductive nitride based material ($Si_3N_4$, AlN, GaN, InN, or the like), a transparent conductive polymer based material (polyaniline (PANI), poly (ethylenedioxythiophene)-polystyrene sulfonate (PEDOT: PSS) or the like), a transparent conductive nano material (CNT, CNT-oxide, Graphene, Graphene-oxide, or the like), or the like may be used as the resistance change material. In addition to the above-described materials, any material which is transparent and has the above-described resistance change characteristic can be used to form the transparent electrode according to the present invention. It should be noted that the statement that the material has a conductivity denotes that the material is allowed to have a conductivity as a result of the forming process.

Figure 4:
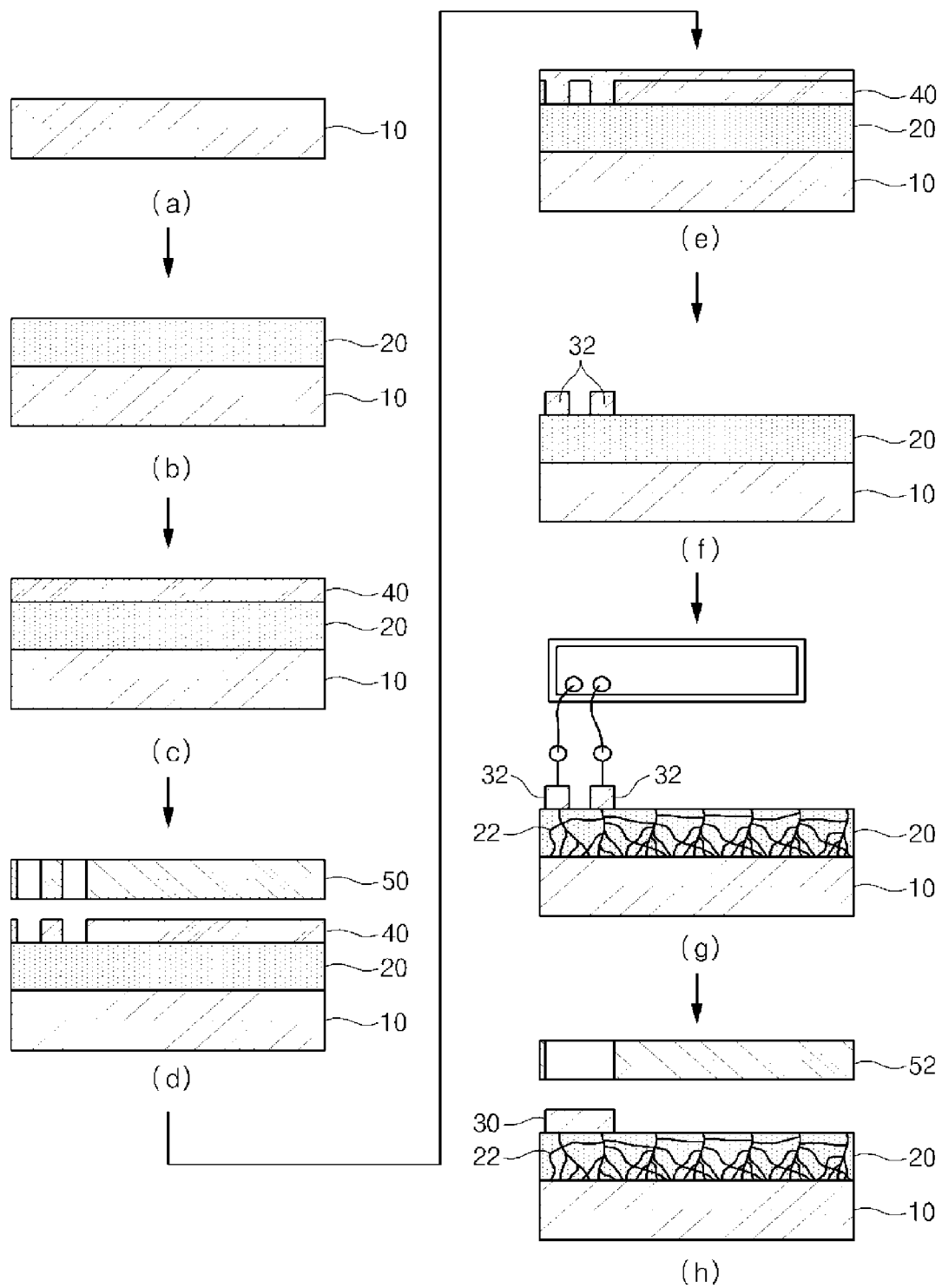
FIG. 4 is a diagram illustrating a method for forming a transparent electrode according to an embodiment of the present invention.

FIG. 4 is a diagram illustrating a method for forming a transparent electrode according to an embodiment of the present invention.

A method for forming a transparent electrode according to the embodiment of the present invention will be described with reference to FIG. 4. First, the transparent electrode 20 is formed on the above-described semiconductor layer 10 ((b) of FIG. 4). The transparent electrode 20 may be formed by vapor-depositing the above-described resistance change material on the semiconductor layer 10.

Next, a photoresist layer (PR) 40 is formed on the transparent electrode 20 ((c) of FIG. 4). A position where an electrode 32 for performing the forming process is to be formed is exposed by using a mask 50 and developed, so that a forming electrode pattern is formed on the photoresist layer ((d) of FIG. 4).

Next, the inner portion of the forming electrode pattern is filed with a metal by vapor-depositing the metal on the photoresist layer 40 where the forming electrode pattern is formed ((e) of FIG. 4). The metal layer and the photoresist layer on the photoresist layer 40 are removed by performing a lift-off process, so that the electrode 32 for performing the forming process is completed ((f) of FIG. 4).

Next, as illustrated in (g) of FIG. 4, if a threshold voltage or more inherent in the material is applied to the electrode 32 formed on the transparent electrode, the conducting filaments 22 are formed in the transparent electrode 20 which is an insulating material, so that the resistance state of the transparent electrode 20 is changed from a high resistance state into a low resistance state.

After the conducting filaments 22 is formed in the transparent electrode 20, a metal electrode pad 30 is formed on the transparent electrode 20 ((h) of FIG. 4)). As a method of forming the metal electrode pad 30, the electrode 32 for performing the forming process may be removed, and a separate metal electrode pad may be formed. As another method, as illustrated in (h) of FIG. 4, a metal is additionally vapor-deposited on the forming electrode 32 by using the mask 52, so that the metal electrode pad 30 may be formed.

Hereinbefore, the method for forming a transparent electrode according to the embodiment of the present invention and the semiconductor device where the transparent electrode is formed by using the method are described.

It should be understood by the ordinarily skilled in the art that, as described above, the transparent electrode according to the present invention can be adapted to any transparent electrode which is in contact with a semiconductor layer, and various modifications can be available according to a semiconductor device to which the transparent electrode according to the present invention is applied.

For example, although the transparent electrode is formed on the semiconductor layer in the above-described example, in the case of an OLED, the transparent electrode may be formed on a glass substrate, and after conducting filaments are formed on the transparent electrode by performing the forming process, a semiconductor layer may be formed on the transparent electrode.

In the embodiment described above with reference to FIGS. 2 and 4, some conducting filaments 22 formed in the transparent electrode 20 may not be connected to other conducting filaments 22. In this case, current flowing into the transparent electrode 20 may not spread over the entire transparent electrode 20 but be concentrated to be localized, so that a problem of current concentration that current is concentrated to be localized on the semiconductor layer 10 which is in contact with the transparent electrode 20 may occur.

Figure 5A:
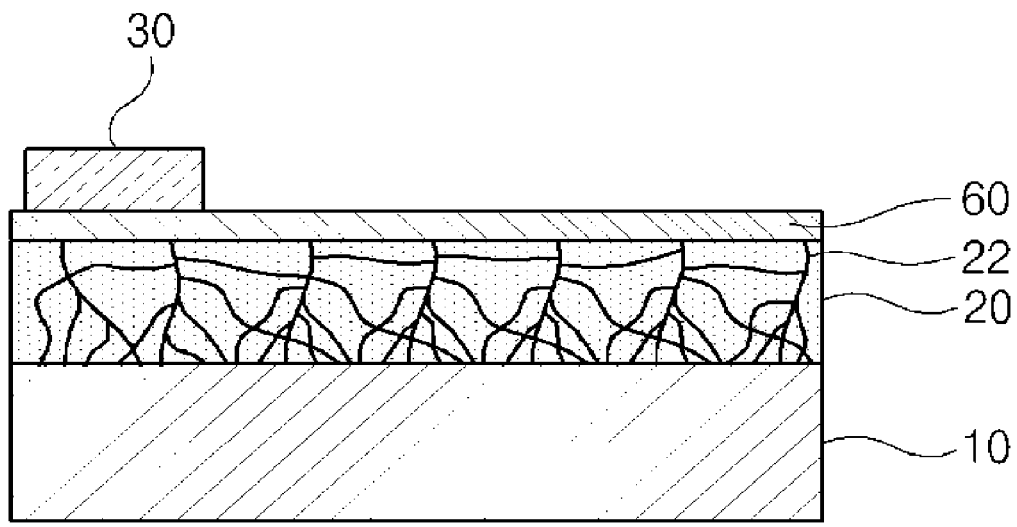
FIGS. 5a and 5b are diagrams illustrating a configuration of a semiconductor device according to another embodiment of the present invention for solving the problem of problem of current concentration.
Figure 5B:
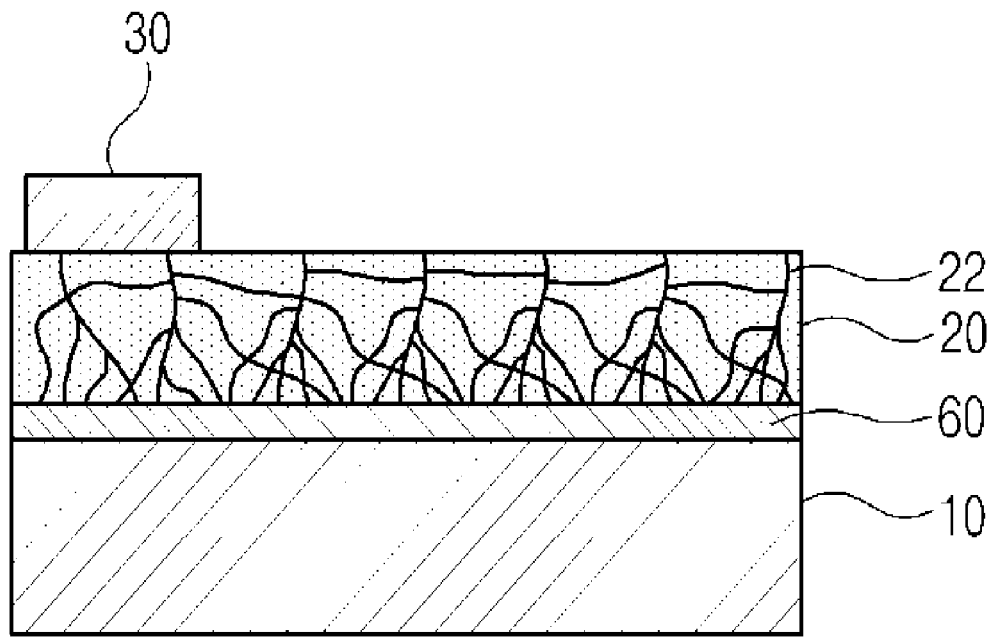

FIGS. 5a and 5b are diagrams illustrating a configuration of a semiconductor device according to another embodiment of the present invention for solving the problem of current concentration.

In the examples illustrated in FIGS. 5a and 5b, in order to improve the current spreading characteristic of the transparent electrode 20, a CNT (carbon nano tube) layer or a graphene layer 60 which connects the conducting filaments 22 formed on the transparent electrode 20 is formed on one surface of the transparent electrode 20. FIG. 5a illustrates an example where the CNT layer or the graphene layer 60 is formed on the surface of the transparent electrode 20 opposite to the surface where the transparent electrode 20 is in contact with the semiconductor layer 10. FIG. 5b illustrates an example where the CNT layer or the graphene layer 60 is formed between the transparent electrode 20 and the semiconductor layer 10.

The CNT and graphene have good conductivity and transmittance characteristics. In the present invention, the conducting filaments 22 in the transparent electrode 20 are connected to each other by forming the CNT layer or the graphene layer 60 on one surface of the transparent electrode 20 by using the characteristics, so that the current flowing into the transparent electrode 20 can be allowed to spread over the entire semiconductor layer 10.

At this time, as the thickness of the CNT layer or the graphene layer 60 is increased, the CNTs or graphenes in the CNT layer or the graphene layer 60 are connected to each other, and thus, the possibility that the conducting filaments 22 are connected to each other is increased. As a result, the conductivity of the transparent electrode 20 is increased, but the transmittance thereof is decreased. Therefore, it is preferable that the CNT layer or the graphene layer 60 according to the present invention is formed with a thickness enough to connect the conducting filaments 22 in the transparent electrode 20 to each other and as thin as possible within a range where the transmittance is not deteriorated.

In another embodiment according to the present invention illustrated in FIGS. 5a and 5b, the CNT layer or the graphene layer 60 is formed with a thickness of about 2 nm to about 100 nm. The thickness of 2 nm is a minimum thickness so that a single layer of CNT or graphene can be formed, and the thickness of 100 nm is a maximum thickness so that transmittance can be maintained to be 80% or more.

The configurations of the examples illustrated in FIGS. 5a and 5b are the same as those of the example described with reference to FIGS. 2 and 4, except that the CNT layer or the graphene layer 60 is formed just before or after the transparent electrode 20 is formed, and thus, the detailed description thereof is omitted.

In addition, in the examples illustrated in FIGS. 5a and 5b, the transparent electrode 20 is formed on the semiconductor layer 10. However, after the transparent electrode is formed, the semiconductor layer may be formed on the transparent electrode. In this case, the CNT layer or the graphene layer may be formed between the transparent electrode and the semiconductor layer. Otherwise, the CNT layer or the graphene layer may be formed on the surface of the transparent electrode opposite to the surface of the transparent electrode which is in contact with the semiconductor layer.

Hereinafter, the transmittance characteristics and ohmic characteristics of the transparent electrodes according to the embodiment of the present invention will be described with reference to FIGS. 6a to 8e.

FIGS. 6a to 6e illustrate a transmittance characteristic, an ohmic characteristic before the forming process, a contact resistance characteristic before the forming process, an ohmic characteristic after the forming process, and a contact resistance characteristic after the forming process in an example where the transparent electrode is formed on a p-GaN semiconductor layer by using an AlN material.

In the example illustrated in FIGS. 6a to 6e, a transparent electrode thin film (thickness: 80 nm) is formed on a p-GaN semiconductor layer, which is widely used for an LED, by using an AlN material having a large band gap of 6.1 eV.

Figure 6A:
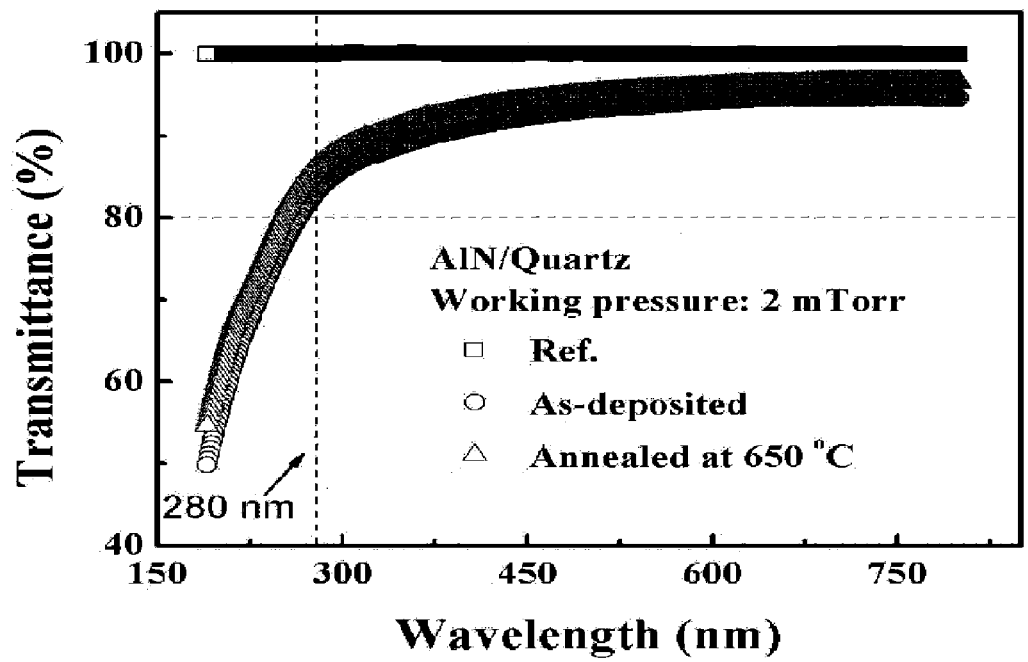
FIGS. 6a to 6e are graphs illustrating a transmittance characteristic, an ohmic characteristic before the forming process, a contact resistance characteristic before the forming process, an ohmic characteristic after the forming process, and a contact resistance characteristic after the forming process in the case where a transparent electrode is formed on a p-GaN semiconductor layer by using an AlN material.

Referring to the graph illustrated in FIG. 6a, in the example, the transmittance to the light in a wavelength range of 170 nm to 800 nm is measured. The transmittance measured for only the quartz is indicated by a reference line (a line of squares); the transmittance measured after forming of the AlN transparent electrode on the p-GaN semiconductor layer is indicated by a line of circles; and the transmittance measured after the thermal treatment at 650° C. after forming of the AlN transparent electrode on the p-GaN semiconductor layer is indicated by a line of triangles.

Figure 1:
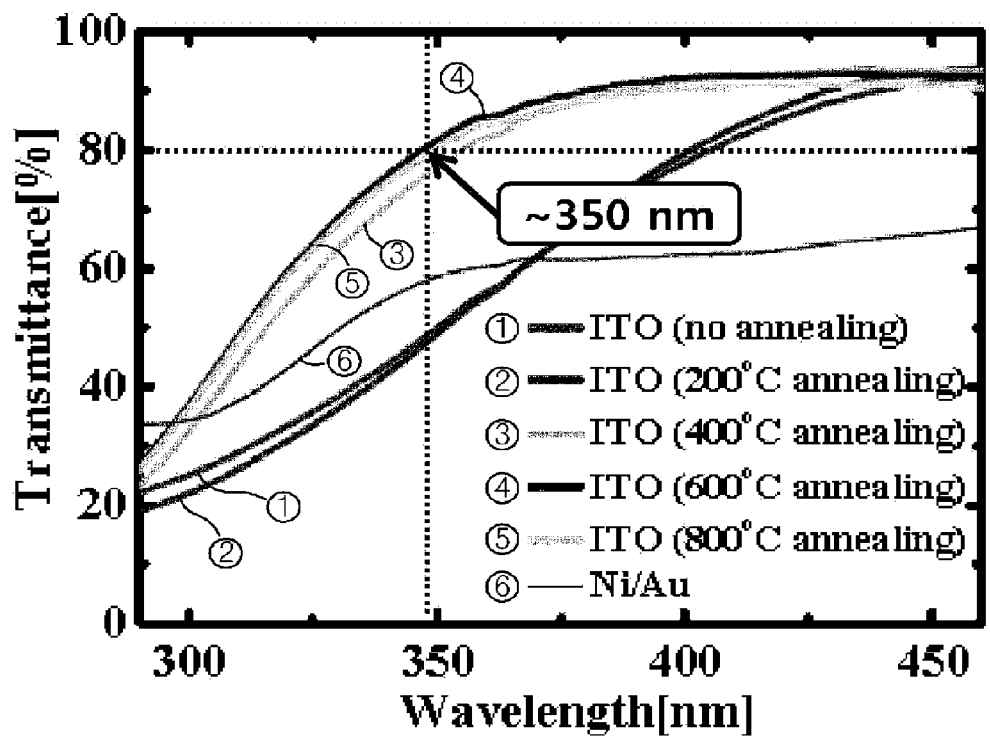
FIG. 1 is a graph illustrating transmittance in the case where an ITO transparent electrode is formed on a p-GaN semiconductor layer in the related art.

It can be understood from the illustrated graphs that the transparent electrode according to the present invention has transmittance of 80% or more with respect to the light in a UV wavelength range of 256 nm or more. It can be understood that the transmittance is greatly improved in comparison to the transmittance of 20% of the ITO transparent electrode in the related art illustrated in FIG. 1.

FIGS. 6b to 6e illustrate ohmic characteristics (FIGS. 6b and 6d) and contact resistance characteristics (FIGS. 6c and 6e) measured by using a TLM (transfer length method) pattern in the cases where a distance between measurement electrodes is 2 μm, 4 μm, 6 μm, 8 μm, and 10 μm.

Figure 6B:
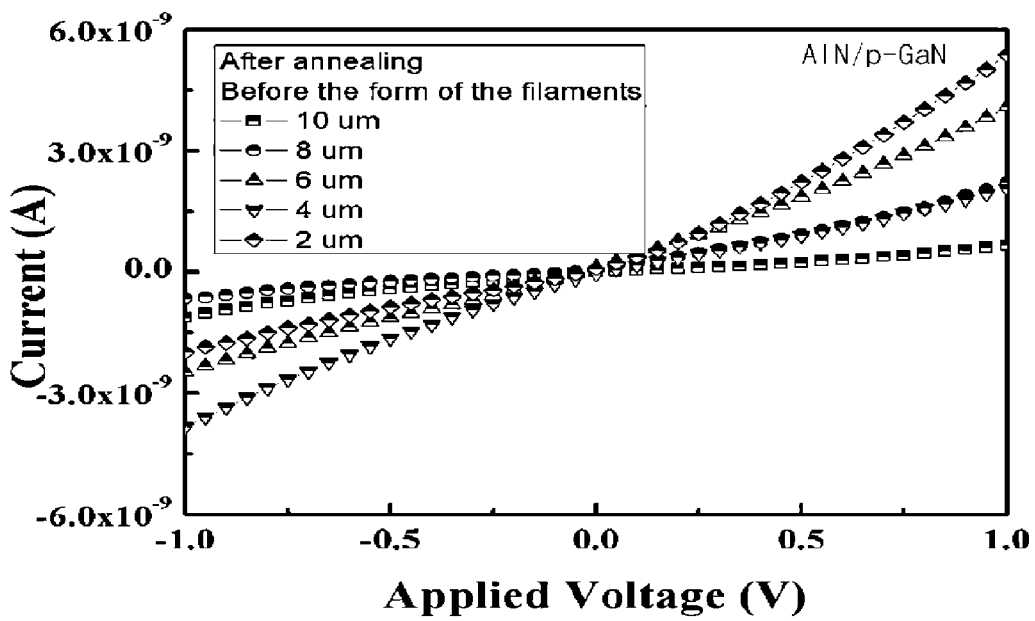
Figure 6C:
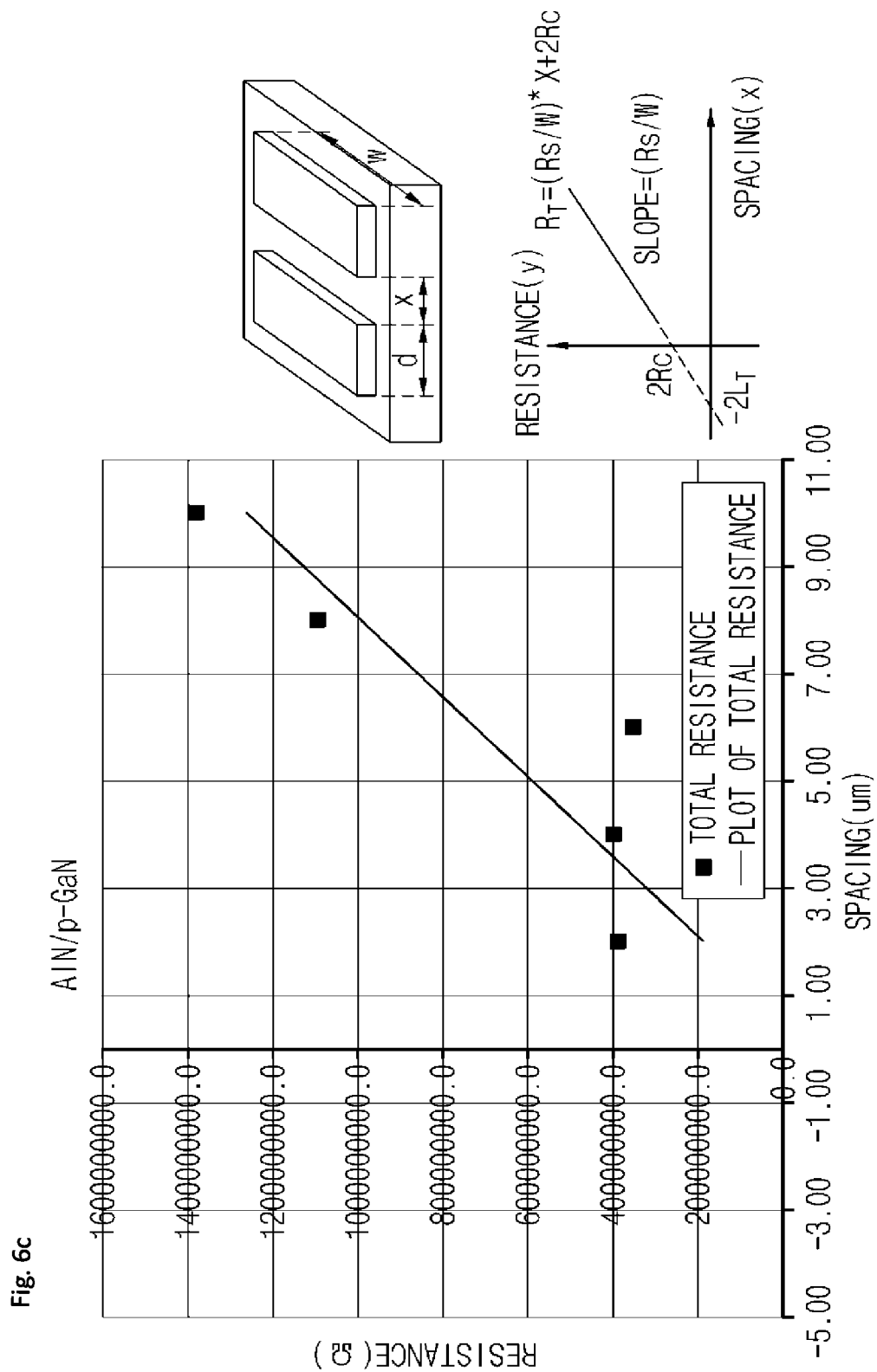

Referring to FIG. 6b, it can be understood that, in the case where the distance between measurement electrodes is 2 μm, before the forming process, when the voltage applied to the transparent electrode is in a range of 0 V to 1.0 V, the current flowing into the transparent electrode is about 0 A to $6.0 \times 10^{-9}$ A, so that the current does not almost flow; and the ohmic characteristic is not good so that the current is not proportional to the voltage. In addition, referring to FIG. 6c, it can be understood that the ohmic contact resistance characteristic does not have linearity.

Figure 6D:
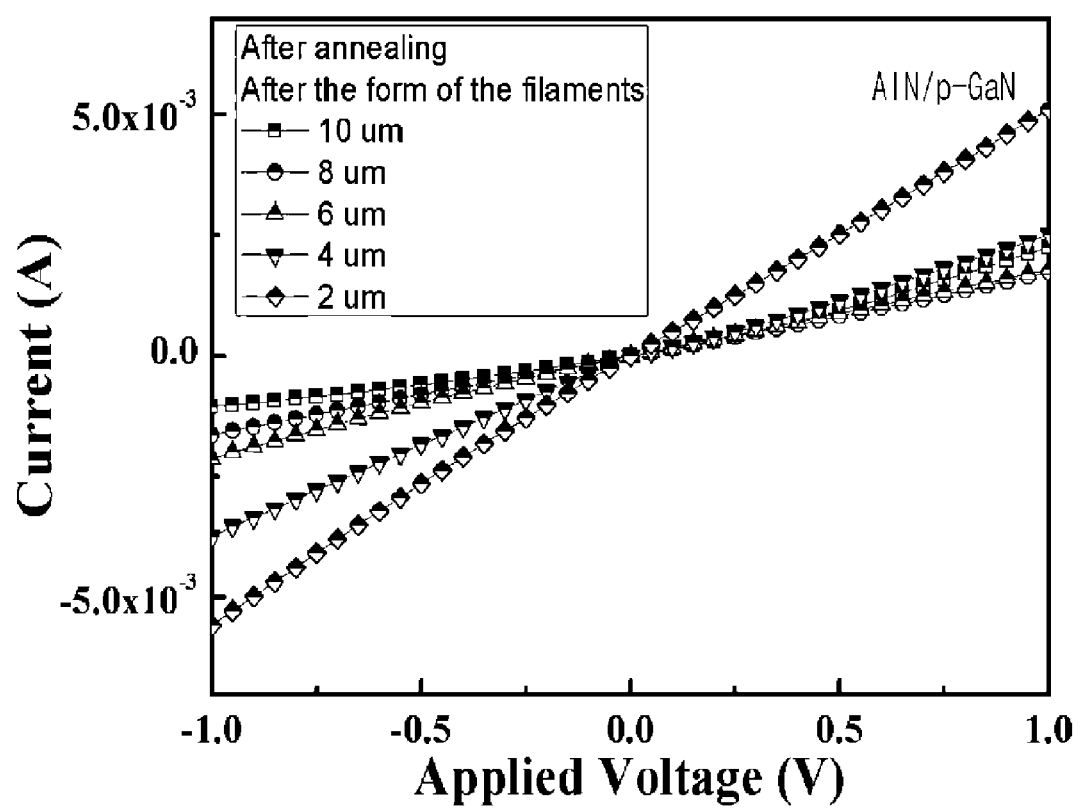
Figure 6E:
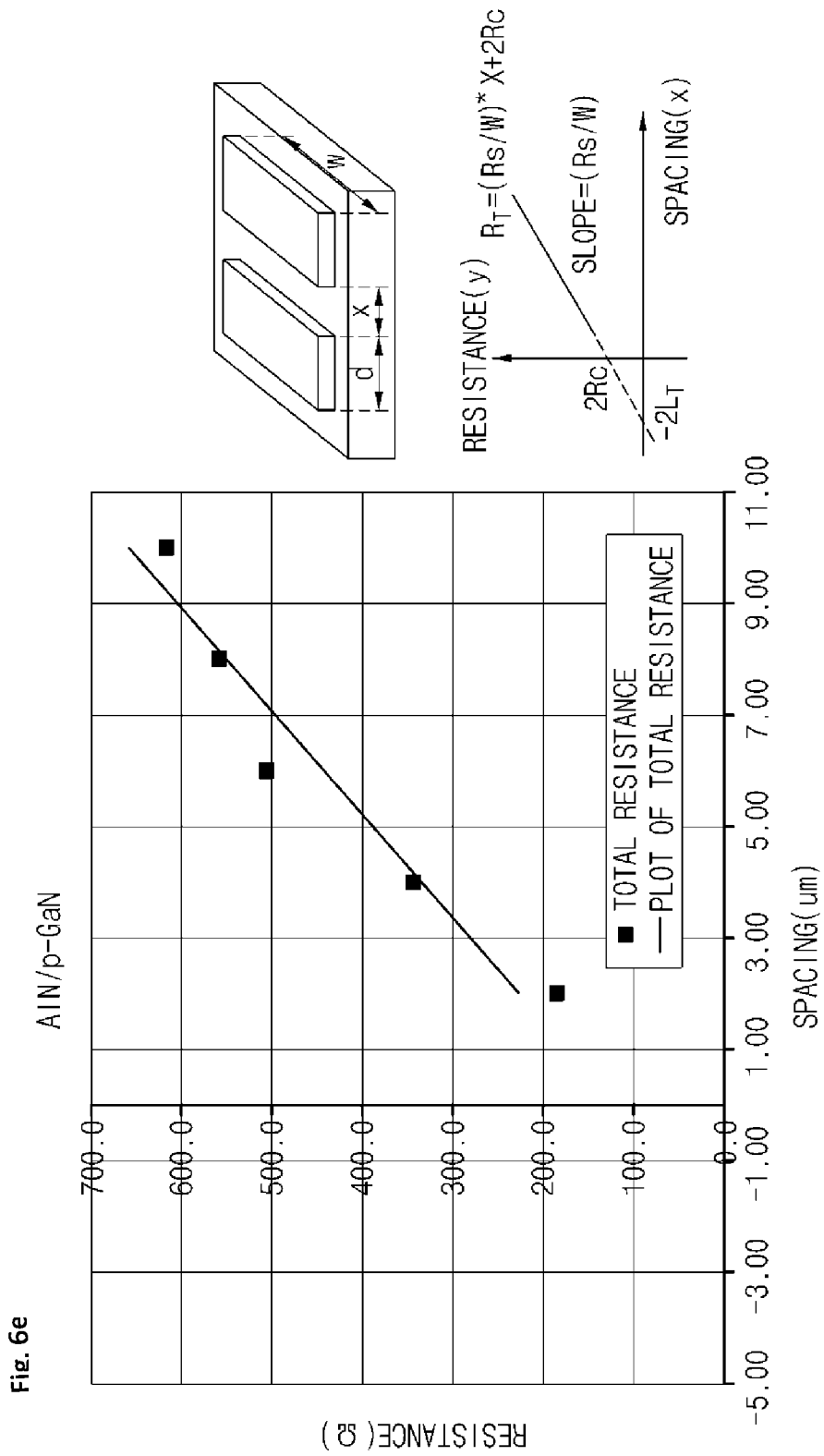

On the contrary, referring to FIG. 6d, it can be understood that, in the case where the distance between measurement electrodes is 2 μm, after the forming process, when the voltage applied to the transparent electrode is in a range of 0 V to 1.0 V, the current flowing into the transparent electrode is about 0 A to $5.0 \times 10^{-3}$ A, which is $10^6$ times the current flowing before the forming process, and the ohmic characteristic is good so that the current is proportional to the voltage. In addition, referring to FIG. 6e, it can be understood that the ohmic contact resistance characteristic has linearity, and thus, the ohmic contact resistance characteristic is relatively improved in comparison to the ohmic contact resistance characteristic before the forming process.

The characteristics of the AlN transparent electrode formed on the p-GaN semiconductor layer in the example illustrated in FIGS. 6a to 6e are summarized as follows. The AlN transparent electrode has transmittance of 80% or more with respect to the light in a UV wavelength range of 257 nm or more. In addition, as a result of the measurement of the contact resistance by using the TLM pattern, the contact resistance before the forming process is 24.113 $\Omega cm^{-2}$, and the contact resistance after the forming process is $1.33 \times 10^{-4}$ $\Omega cm^{-2}$. Therefore, the conductivity of the transparent electrode is greatly improved, and the ohmic characteristic thereof is good.

FIGS. 7a to 7e illustrate a transmittance characteristic, an ohmic characteristic before the forming process, a contact resistance characteristic before the forming process, an ohmic characteristic after the forming process, and a contact resistance characteristic after the forming process in an example where the transparent electrode is formed on a p-GaN semiconductor layer by using a $Ga_2O_3$ material.

In the example illustrated in FIGS. 7a to 7e, a transparent electrode thin film (thickness: 80 nm) is formed on a p-GaN semiconductor layer, which is widely used for an LED, by using a $Ga_2O_3$ material.

Figure 7A:
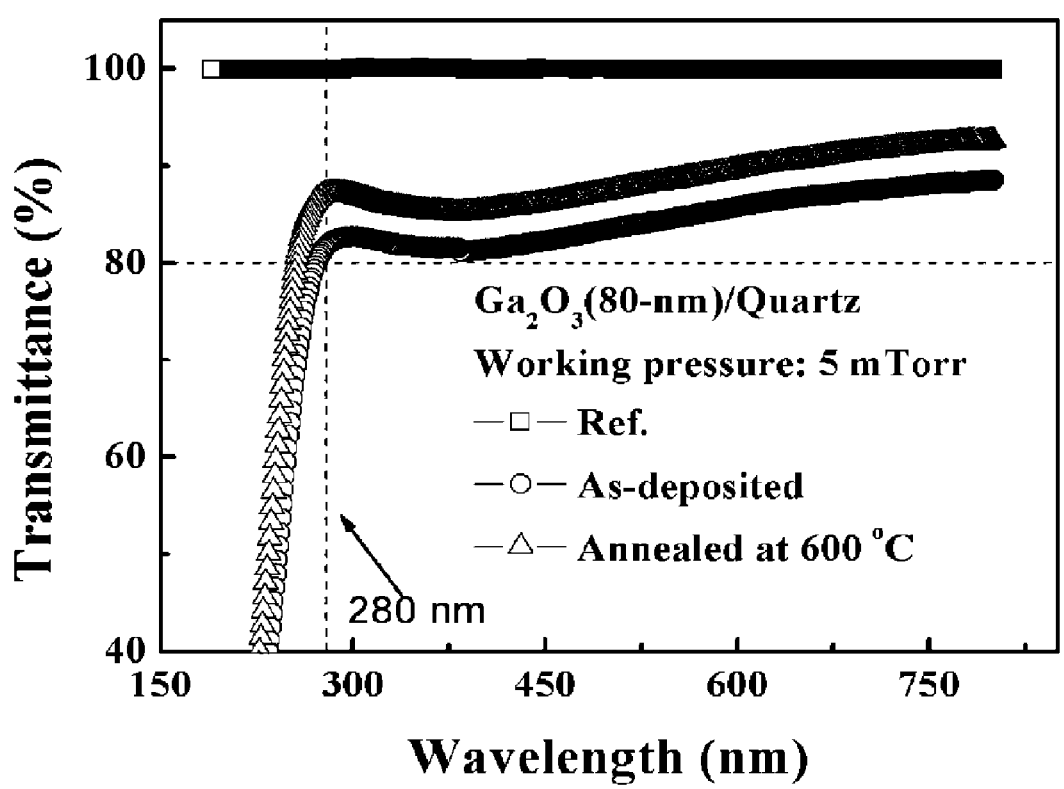
FIG. 7a to FIG. 7e are graphs illustrating a transmittance characteristic, an ohmic characteristic before the forming process, a contact resistance characteristic before the forming process, an ohmic characteristic after the forming process, and a contact resistance characteristic after the forming process in the case where a transparent electrode is formed on a p-GaN semiconductor layer by using a $Ga_2O_3$ material.

Referring to the graph illustrated in FIG. 7a, in the example, it can be understood that the $Ga_2O_3$ transparent electrode has transmittance of 80% or more with respect to the light in a UV wavelength range of 264 nm or more. It can be understood that the transmittance of the transparent electrode of the example is also greatly improved in comparison to the transmittance of 20% of the ITO transparent electrode in the related art illustrated in FIG. 1.

FIGS. 7b to 7e illustrate ohmic characteristics (FIGS. 7b and 7d) and contact resistance characteristics (FIGS. 7c and 7e) measured by using a TLM pattern in the case where a distance between measurement electrodes is 2 μm, 4 μm, 6 μm, 8 μm, and 10 μm.

Figure 7B:
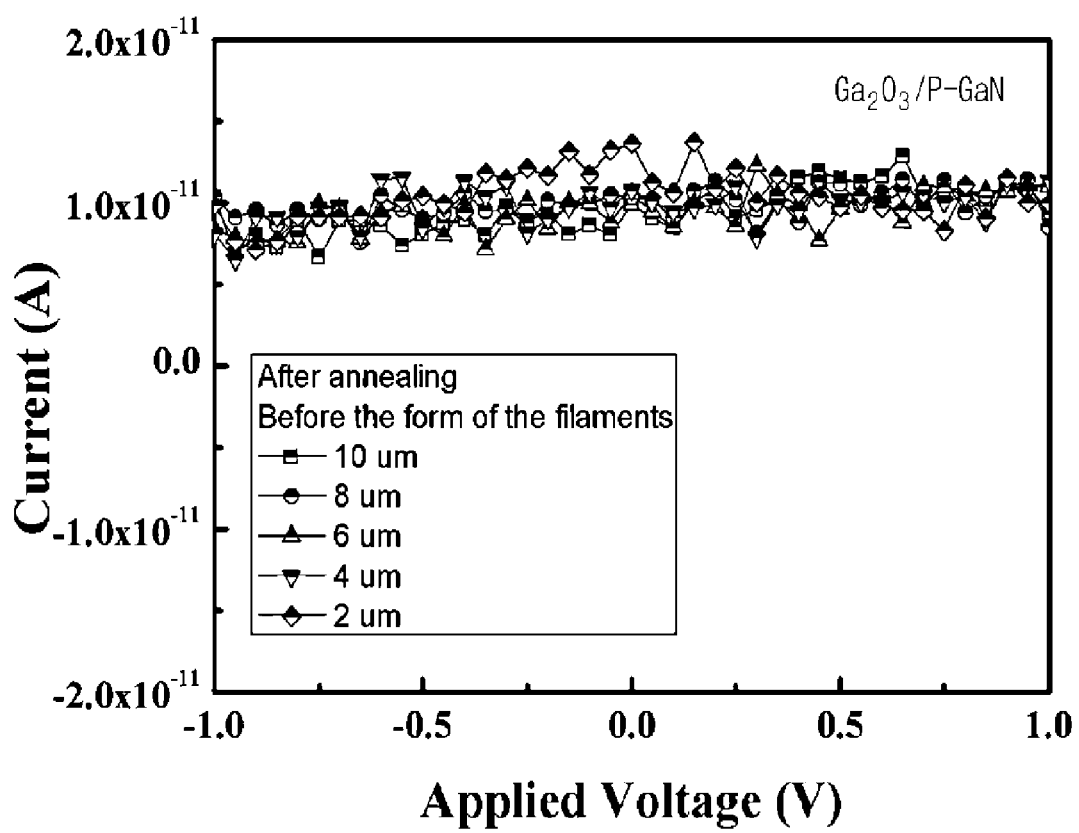
Figure 7C:
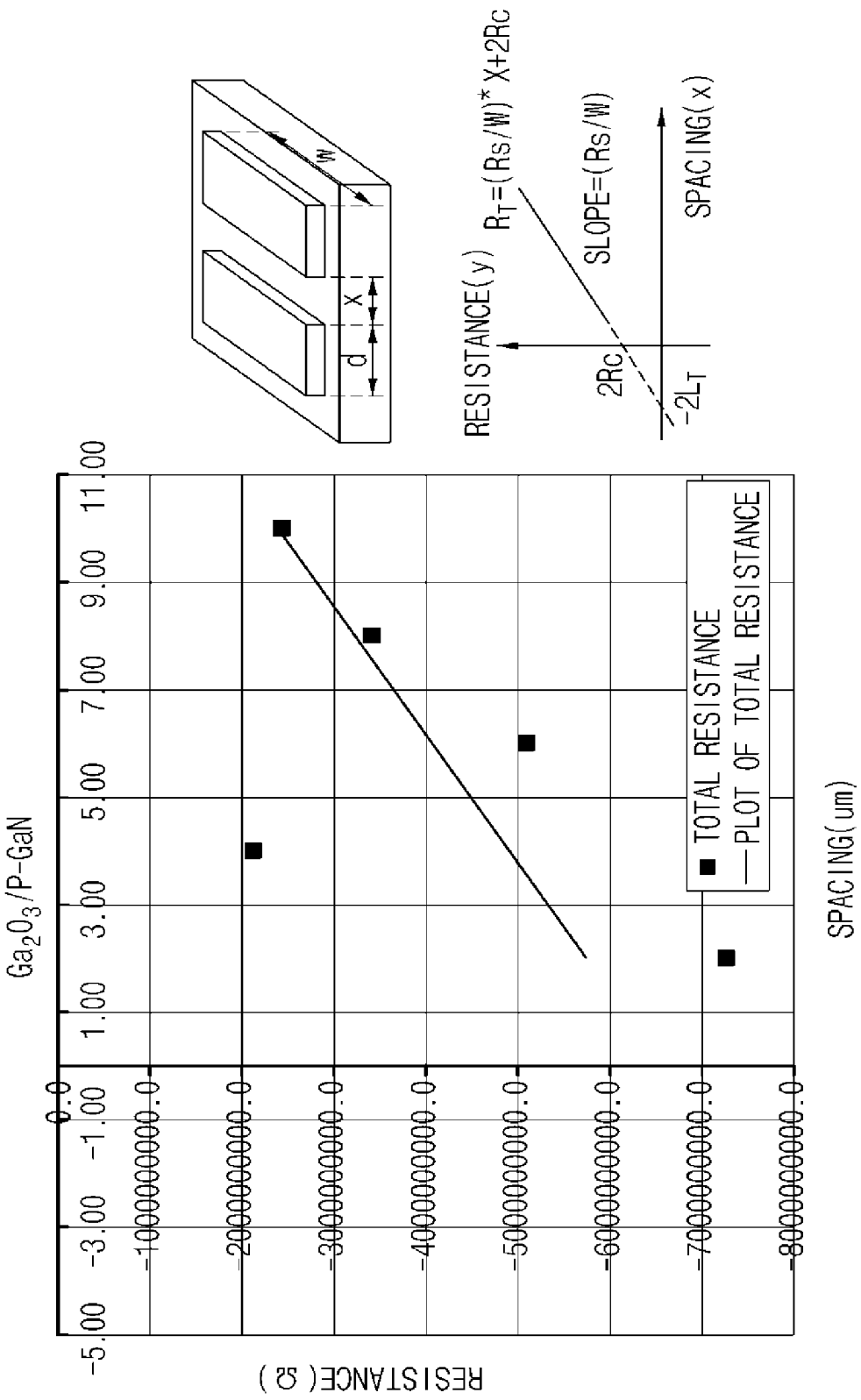

Referring to FIG. 7b, it can be understood that, in the case where the distance between measurement electrodes is 2 μm, before the forming process, the current flowing into the transparent electrode is about $1.0 \times 10^{-11}$ A irrespective of the applied voltage, so that the transparent electrode does not have ohmic characteristic. In addition, referring to FIG. 7c, it can be understood that the ohmic contact resistance characteristic does not have linearity.

Figure 7D:
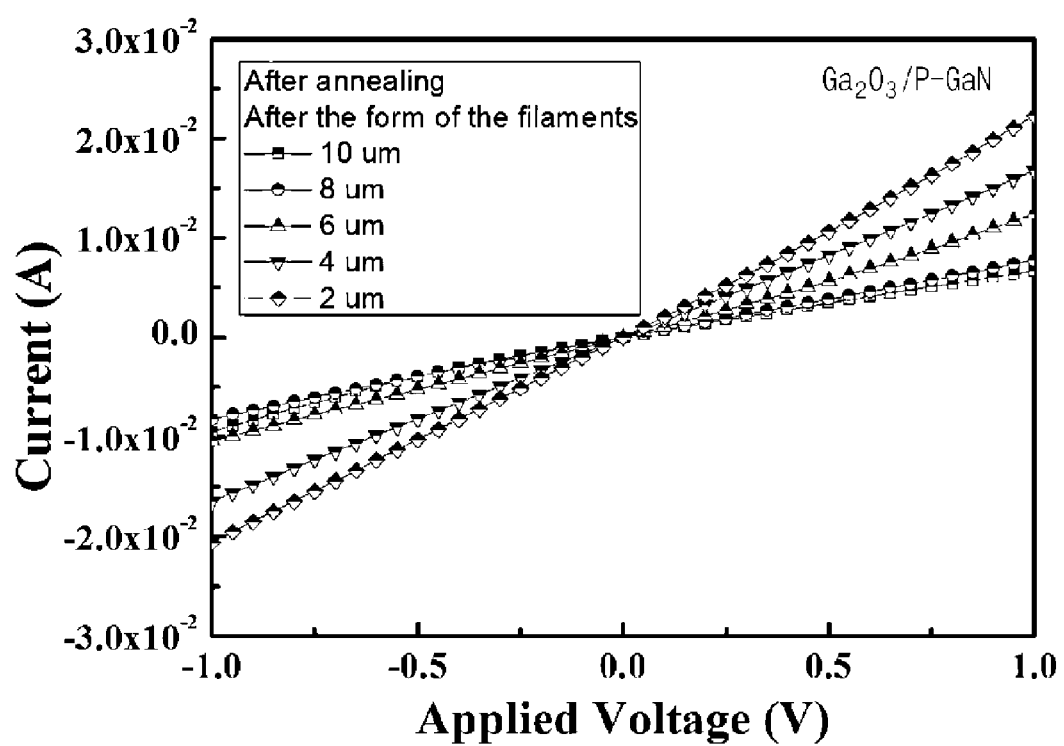
Figure 7E:
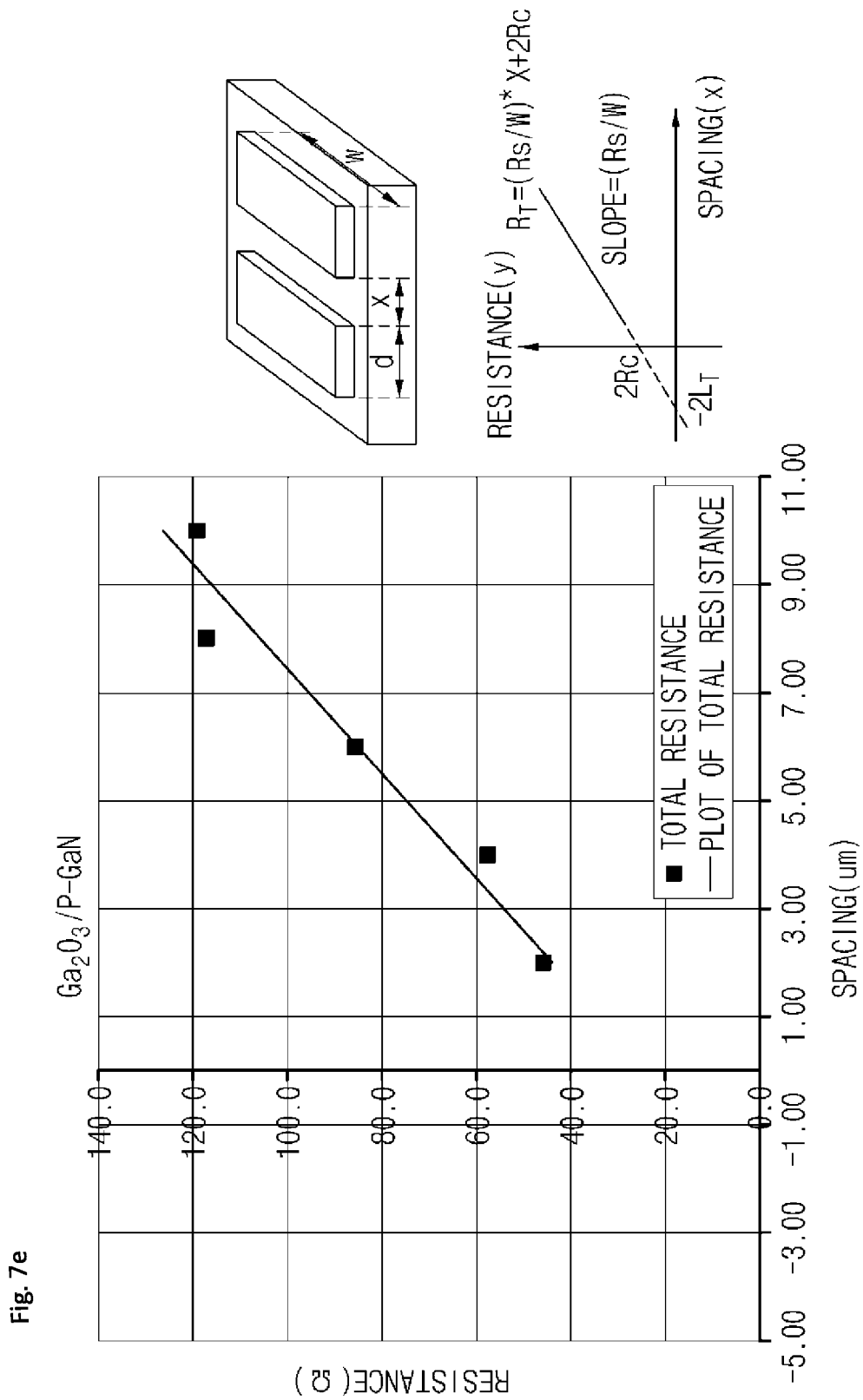

On the contrary, referring to FIG. 7d, it can be understood that, in the case where the distance between measurement electrodes is 2 μm, after the forming process, when the voltage applied to the transparent electrode is in a range of 0 V to 1.0 V, the current flowing into the transparent electrode is about 0 A to $2.0 \times 10^{-2}$ A, which is $10^9$ times the current flowing before the forming process. Accordingly, it can be understood that the ohmic characteristic is good so that the current is proportional to the voltage. In addition, referring to FIG. 7e, it can be understood that the ohmic contact resistance characteristic has linearity, and thus, the ohmic contact resistance characteristic is relatively improved in comparison to the ohmic contact resistance characteristic before the forming process.

The characteristics of the $Ga_2O_3$ transparent electrode formed on the p-GaN semiconductor layer in the example illustrated in FIGS. 7a to 7e are summarized as follows. The $Ga_2O_3$ transparent electrode has transmittance of 80% or more with respect to the light in a UV wavelength range of 264 nm or more. In addition, as a result of the measurement of the contact resistance by using the TLM pattern, the contact resistance before the forming process is 51,680 $\Omega cm^{-2}$, and the contact resistance after the forming process is $2.64 \times 10^{-5}$ $\Omega cm^{-2}$. Therefore, the conductivity of the transparent electrode is greatly improved, and the ohmic characteristic thereof is good.

FIGS. 8a to 8e illustrate a transmittance characteristic, an ohmic characteristic before the forming process, a contact resistance characteristic before the forming process, an ohmic characteristic after the forming process, and a contact resistance characteristic after the forming process in an example where the transparent electrode is formed on a p-Si semiconductor layer by using an AlN material.

Figure 8A:
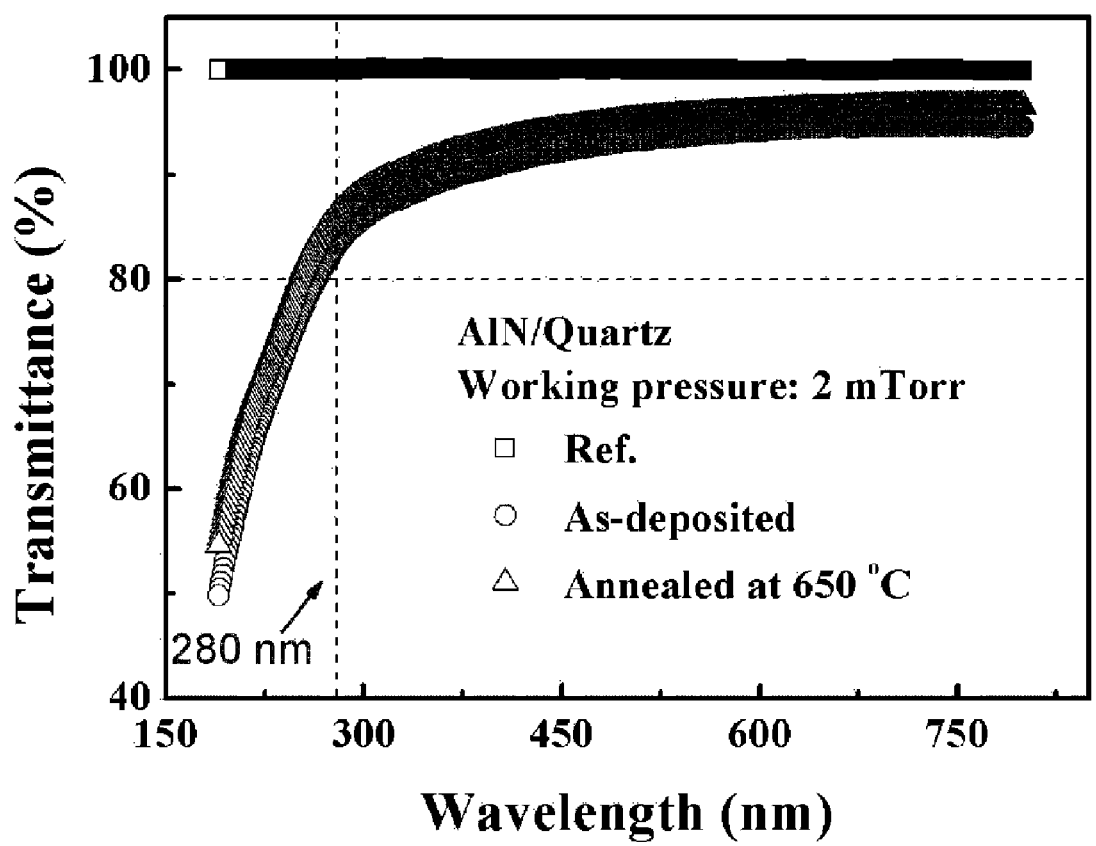
FIGS. 8a to 8e are graphs illustrating a transmittance characteristic, an ohmic characteristic before the forming process, a contact resistance characteristic before the forming process, an ohmic characteristic after the forming process, and a contact resistance characteristic after the forming process in the case where a transparent electrode is formed on a p-Si semiconductor layer by using an AlN material.
Figure 8B:
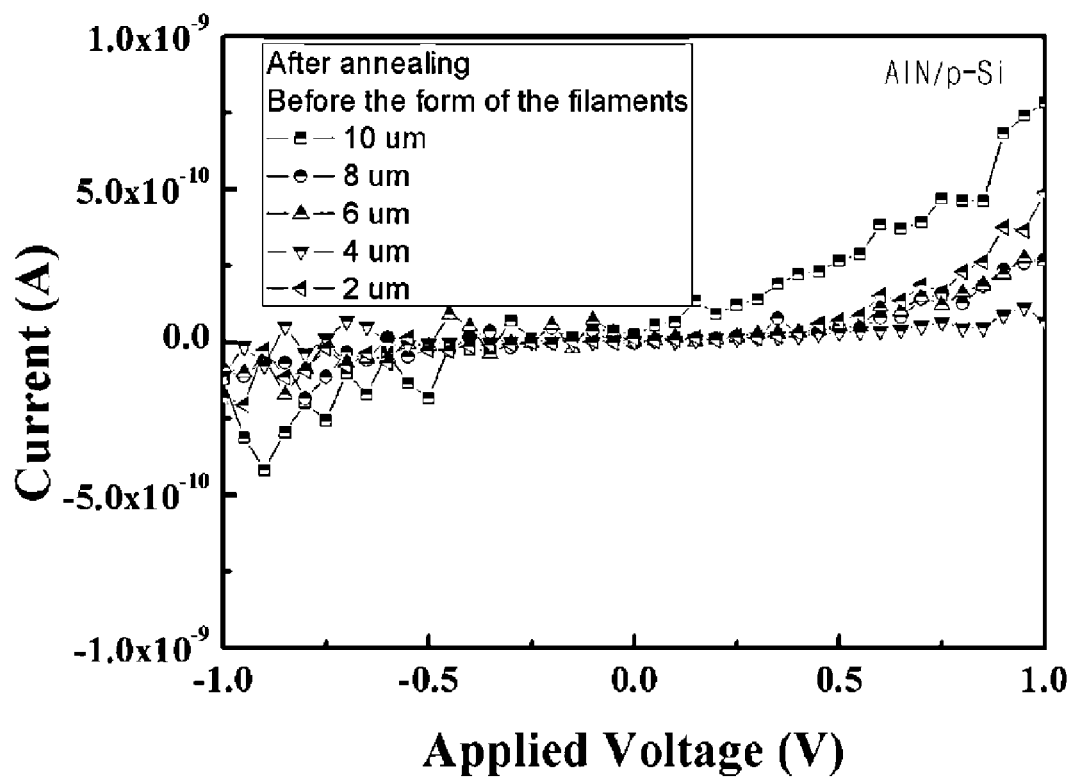
Figure 8C:
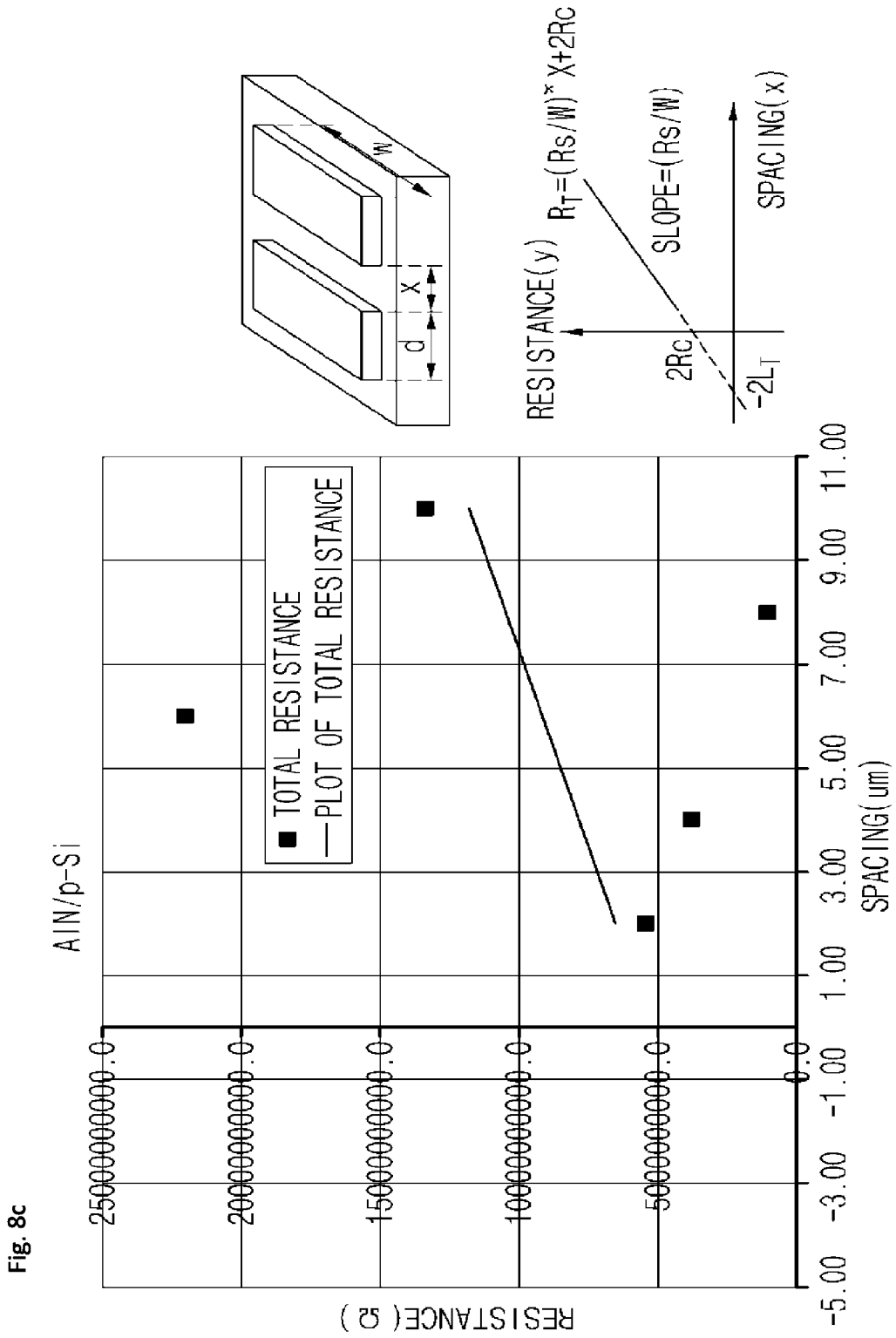

In the example illustrated in FIGS. 8a and 8b, a transparent electrode thin film (thickness: 80 nm) is formed on a p-Si semiconductor layer by using an AlN material.

Referring to the graph illustrated in FIG. 8a, it can be understood that the AlN transparent electrode according to the present invention has transmittance of 80% or more with respect to the light in a UV wavelength range of 257 nm or more. It can be understood that the transmittance of the transparent electrode of the example is also greatly improved in comparison to the transmittance of 20% of the ITO transparent electrode in the related art illustrated in FIG. 1.

FIG. 8b to FIG. 8e illustrate contact resistance characteristics (FIGS. 8c and. 8e) measured by using a TLM pattern in the case where a distance between measurement electrodes is 2 μm, 4 μm, 6 μm, 8 μm, and 10 μm.

Referring to FIG. 8b, it can be understood that, in the case where the distance between measurement electrodes is 2 μm, before the forming process, the current flowing into the transparent electrode is about 0 A to about $0.5\times10^{-9}$ A irrespective of the applied voltage, so that the transparent electrode does not have ohmic characteristic. In addition, referring to FIG. 8, it can be understood that the ohmic contact resistance characteristic does not have linearity.

Figure 8D:
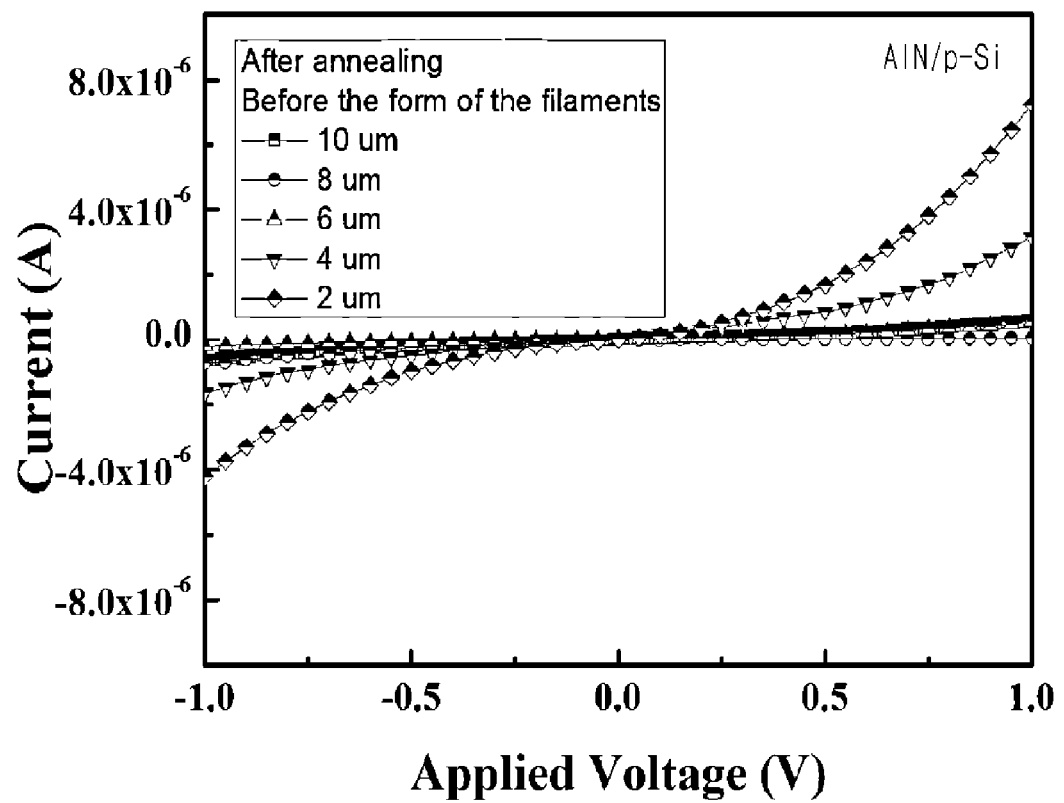
Figure 8E:
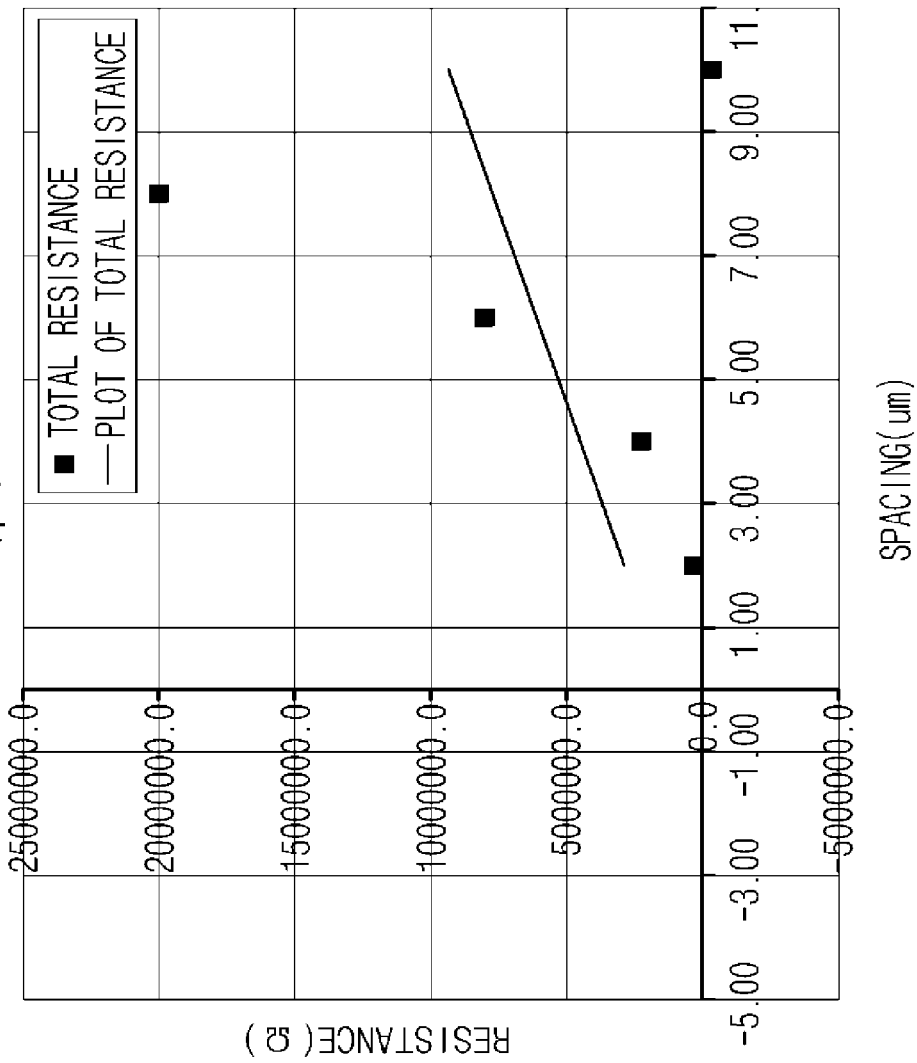
Figure 8E:
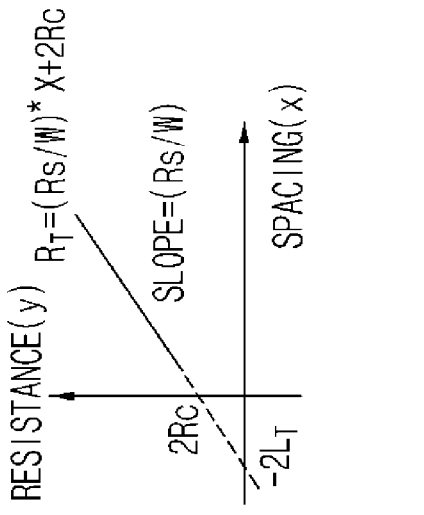
Figure 8E:
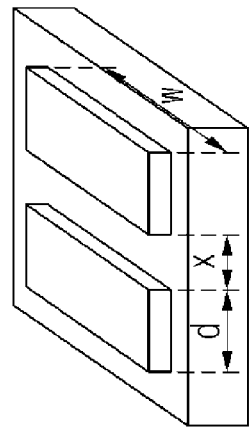

On the contrary, referring to FIG. 8d, it can be understood that, in the case where the distance between measurement electrodes is 2 μm, after the forming process, when the voltage applied to the transparent electrode is in a range of 0 V to 1.0 V, the current flowing into the transparent electrode is about 0 A to about $8.0\times10^{-6}$ A, which is $10^3$ times the current flowing before the forming process. Accordingly, it can be understood that, although the current is not directly proportional to the voltage, the ohmic characteristic is better than that before the forming process. In addition, referring to FIG. 8e, it can be understood that the ohmic contact resistance characteristic has linearity, and thus, the ohmic contact resistance characteristic is relatively improved in comparison to the ohmic contact resistance characteristic before the forming process.

The characteristics of the AlN transparent electrode formed on the p-Si semiconductor layer in the example illustrated in FIGS. 8a to 8e are summarized as follows. The AlN transparent electrode has transmittance of 80% or more with respect to the light in a UV wavelength range of 257 nm or more. In addition, as a result of the measurement of the contact resistance by using the TLM pattern, the contact resistance before the forming process is 20,816 $\Omega cm^{-2}$, and the contact resistance after the forming process is $9.21\times10^{-4}$ $\Omega cm^{-2}$. Therefore, the conductivity of the transparent electrode is greatly improved, and the ohmic characteristic thereof is good.

As described above with reference to FIGS. 6a to 8e, the transmittance characteristic and the ohmic characteristic of the transparent electrode according to the embodiments of the present invention are greatly improved in comparison to those of the transparent electrode in the related art.

The following Table 1 lists transmittance characteristics and contact resistance characteristics of an ITO transparent electrode and transparent electrodes used in the related art. The following Table 2 lists transmittance characteristics and contact resistance characteristics of the transparent electrode according to the embodiments of the present invention.

TABLE 1

| Material | TRANSMITTANCE | CONTACT RESISTANCE |
|---|---|---|
| ITO | 80% in a wavelength range of 350 nm or more | $1.12\times10^{-3}$ $\Omega cm^{-2}$ |
| ZnO | average 75% in a wavelength range of 400 nm to 700 nm | $1.2\times10^{-2}$ $\Omega cm^{-2}$ |
| AZO | 80% in a wavelength range of 350 nm or more | $1.10\times10^{-2}$ $\Omega cm^{-2}$ |
| $Ga_2O_3$ | 70% in a wavelength range of 285 nm or more | N/A |

TABLE 2

| Material | TRANSMITTANCE | CONTACT RESISTANCE |
|---|---|---|
| AlN | 80% in a wavelength range of 257 nm or more | $1.33\times10^{-4}$ $\Omega cm^{-2}$ |
| $Ga_2O_3$ | 80% in a wavelength range of 264 nm or more | $2.64\times10^{-5}$ $\Omega cm^{-2}$ |

As can be understood from Tables 1 and 2, the transmittance characteristic and the contact resistance characteristic of the transparent electrode according to the present invention are greatly improved in comparison to those of the transparent electrode in the related art.

While the present invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A semiconductor device comprising:
   a semiconductor layer; and
   a transparent electrode of which one surface is in contact with the semiconductor layer and of which resistance state is changed from a high resistance state into a low resistance state according to an applied electric field,
   wherein conducting filaments are formed in the transparent electrode by performing a forming process.

2. The semiconductor device according to claim 1, further comprising a metal electrode pad which is formed with a metal on a surface of the transparent electrode opposite to the one surface of the transparent electrode which is in contact with the semiconductor layer.

3. The semiconductor device according to claim 1, wherein the transparent electrode is formed by using a transparent insulating material which is to be changed to have conductivity if a forming process is performed on the material by applying a threshold voltage or more inherent in the material.

4. The semiconductor device according to claim 1, wherein the transparent electrode is in ohmic contact with the semiconductor layer.

5. The semiconductor device according to claim 1, wherein the semiconductor layer is doped as an n type or a p type.

6. The semiconductor device according to claim 1, wherein the transparent electrode is constructed with any one of a transparent oxide based material, a transparent nitride based material, a transparent polymer based material, and a transparent nano material.

7. The semiconductor device according to claim 1, further comprising a CNT layer or a graphene layer which is formed on a surface of the transparent electrode opposite to the one surface of the transparent electrode which is in contact with the semiconductor layer.

8. The semiconductor device according to claim 1, further comprising a CNT layer or a graphene layer which is formed between the transparent electrode and the semiconductor layer.

9. A method for forming a transparent electrode, comprising:
- (a) forming a transparent electrode by using a transparent material of which resistance state is to be changed from a high resistance state into a low resistance state according to an applied electric field; and
- (b) performing a forming process of changing the resistance state of the transparent electrode to the low resistance state by applying a voltage to the transparent electrode,
- wherein, in the (b) performing of the forming process, conducting filaments are formed in an insulating material of the transparent electrode which the forming process is performed on.

10. The method according to claim 9, wherein, in the (a) forming of the transparent electrode, the transparent electrode is formed on a semiconductor layer.

11. The method according to claim 10, further comprising (c) forming a CNT layer or a graphene layer on the transparent electrode which the forming process is performed on.

12. The method according to claim 9, wherein, in the (a) forming of the transparent electrode, the transparent electrode is formed on a CNT layer or a graphene layer which is formed on a semiconductor layer.

13. The method according to claim 9, further comprising (d) forming a semiconductor layer on the transparent electrode which the forming process is performed on.

14. The method according to claim 9, further comprising (e) forming a CNT layer or a graphene layer on the transparent electrode on which the forming process is performed and forming a semiconductor layer on the CNT layer or the graphene layer.

15. The method according to claim 9, wherein, in the (a) forming of the transparent electrode, the transparent electrode is formed on a CNT layer or a graphene layer.

16. The method according to claim 9, further comprising (f) forming a metal electrode pad on the transparent electrode.

17. The method according to claim 9, wherein the transparent electrode is formed by using a transparent insulating material which is to be changed to have conductivity if a forming process is performed on the material by applying a threshold voltage or more inherent in the material.

18. The method according to claim 9, wherein the transparent electrode is formed so as to be in ohmic contact with a semiconductor layer.

19. The method according to claim 18, wherein the semiconductor layer is doped as an n type or a p type.

20. The method according to claim 9, wherein, in the (b) performing of the forming process, a metal electrode is formed on the transparent electrode, and the forming process is performed by applying a threshold voltage or more inherent in a material of the transparent electrode to the metal electrode.

21. The method according to claim 9, wherein the (b) performing of the forming process comprises:
- (b1) forming photoresist on the transparent electrode;
- (b2) forming a pattern corresponding to a pair of electrodes on the photoresist;
- (b3) forming a pair of the electrodes by using the photoresist pattern; and
- (b4) removing the photoresist pattern and performing the forming process by applying a threshold voltage or more inherent in a material of the transparent electrode to a pair of the electrodes.

22. The method according to claim 9, wherein the transparent electrode is constructed with any one of a transparent oxide based material, a transparent nitride based material, a transparent polymer based material, and a transparent nano material.

* * * * *